(12) United States Patent
Satoh et al.

(10) Patent No.: US 7,378,333 B2
(45) Date of Patent: May 27, 2008

(54) SEMICONDUCTOR DEVICE AND MANUFACTURING METHOD THEREOF

(75) Inventors: Toshiya Satoh, Kanasagou-machi (JP); Masahiko Ogino, Hitachi (JP); Tadanori Segawa, Hitachi (JP); Yoshihide Yamaguchi, Fujisawa (JP); Hiroyuki Tenmei, Yokohama (JP); Atsushi Kazama, Chiyoda-machi (JP); Ichiro Anjo, Koganei (JP); Asao Nishimura, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 125 days.

(21) Appl. No.: 11/168,460

(22) Filed: Jun. 29, 2005

(65) Prior Publication Data

US 2005/0245061 A1 Nov. 3, 2005

Related U.S. Application Data

(62) Division of application No. 09/809,181, filed on Mar. 16, 2001, now Pat. No. 6,946,723.

(30) Foreign Application Priority Data

Aug. 7, 2000 (JP) ............................. 2000-238814

(51) Int. Cl.
*H01L 21/301* (2006.01)
(52) U.S. Cl. .................. 438/462; 438/106; 438/127; 257/787; 257/678; 257/E21.599
(58) Field of Classification Search ................. 438/462
See application file for complete search history.

(56) References Cited

U.S. PATENT DOCUMENTS 5,148,265 A 9/1992 Khandros et al.

5,757,078 A 5/1998 Matsuda (Continued)

FOREIGN PATENT DOCUMENTS

JP 09-232256 A1 9/1997

(Continued)

OTHER PUBLICATIONS

Nikkei Microdevices, CSP, Feb. 1998, pp. 40-64.

(Continued)

*Primary Examiner*—Jerome Jackson
*Assistant Examiner*—José R Diaz
(74) *Attorney, Agent, or Firm*—Antonelli, Terry, Stout & Kraus, LLP.

(57) ABSTRACT

The present invention is a semiconductor device having the semiconductor element obtained by cutting a semiconductor wafer with the electrode pad formed on one side along a scribe line, a semiconductor element protective layer on the semiconductor element which has a opening on the pad, a stress cushioning layer on the layer which has the opening on the pad, a lead wire portion reaching the layer from the electrode pad via the openings, external electrodes on the lead wire portion, and the conductor protective layer on the layers, the layer and the conductor protective layer forming the respective end faces on the end surface of the semiconductor element inside the scribe line and exposing the range from the end face of the end surface to the inside of the scribe line.

19 Claims, 19 Drawing Sheets

U.S. PATENT DOCUMENTS

| | | |
|---|---|---|
| 5,773,888 A | 6/1998 | Hosomi et al. |
| 5,888,849 A | 3/1999 | Johnson |
| 6,097,085 A | 8/2000 | Ikemizu et al. |
| 6,111,317 A | 8/2000 | Okada et al. |
| 6,258,631 B1 | 7/2001 | Ito et al. |
| 6,313,532 B1 | 11/2001 | Shimoshitaka et al. |
| 6,320,267 B1 | 11/2001 | Yukawa |
| 6,326,701 B1 * | 12/2001 | Shinogi et al. ............. 257/797 |
| 6,452,270 B1 | 9/2002 | Huang |
| 6,608,389 B1 | 8/2003 | Hashimoto |
| 6,624,504 B1 | 9/2003 | Inour et al. |
| 2002/0068424 A1 | 6/2002 | Hashimoto |
| 2002/0130412 A1 | 9/2002 | Nagai et al. |

FOREIGN PATENT DOCUMENTS

| | | |
|---|---|---|
| JP | 10-027827 A1 | 1/1998 |
| JP | 10-092865 A1 | 4/1998 |

OTHER PUBLICATIONS

Nikkei Microdevices, CSP, Apr. 1998, pp. 164-167.

* cited by examiner

SEMICONDUCTOR DEVICE AND MANUFACTURING METHOD THEREOF

CROSS-REFERENCE TO RELATED APPLICATIONS

This is a divisional of application Ser. No. 09/809,181 filed 16 Mar. 2001, now U.S. Pat. No. 6,946,723, the contents of which are incorporated herein by reference in its entirety.

BACKGROUND OF THE INVENTION

The present invention relates to a semiconductor device and to a method of method of manufacture thereof; and, more particularly, the invention relates to a semiconductor device in which a semiconductor element has at least a stress cushioning layer and a semiconductor protective layer, and the end faces of these layers are positioned inside the cutting scribe lines formed on a semiconductor wafer, and the range of the surface at the end of the semiconductor element from the end face to the inside of the scribe line is exposed.

Recently, there has been an increasing demand for miniaturization and high performance in various electronic elements; and, in association with this demand, there have also been requests for a semiconductor device using electronic elements capable of speeding up information processing, as well as high density packing and high density assembly of the electron elements. Namely, in correspondence with these requests, there have been changes in the general character of a semiconductor device from the pin insertion type to the surface mounting type so as to increase the mounting density; and order to provide a multi-pin configuration, various packages from a DIP (dual inline package) to a QFP (quad flat package) or a PGA (pin grid array) have been developed.

However, in the QFP type package, the connection lead wires for connecting with the mounting substrate are centralized in the peripheral part of the package and the connection lead wires themselves are thin and deformable, so that, as the number of pins increases, the mounting becomes more difficult. In the PGA type package, the terminals to be connected to the mounting substrate are thin and long and a considerable number of terminals are centralized, so that high speed processing of information is difficult from the viewpoint of characteristics; and, moreover, the PGA arrangement is of a pin insertion type, so that surface mounting is not available, and it is disadvantageous in a high density assembly.

Recently, to solve various problems concerning these packages and to realize a semiconductor capable of high speed processing of information, a BGA (ball grid array) package having a stress cushioning layer between the semiconductor element and the substrate on which a wiring circuit is formed and a bump electrode which is an external terminal on the mounting substrate surface side of the substrate with the wiring circuit has been developed, and the details thereof are disclosed in the specification of U.S. Pat. No. 5,148,265. In the package described in the specification of U.S. Pat. No. 5,148,265, since the terminals to be connected to the mounting substrate are ball-shaped solder terminals, the lead wires are free of deformation, unlike the QFP type; and, since the terminals are scattered over the entire mounting surface, the pitch between the terminals is large and surface mounting can be carried out easily. The bump electrode which is an external terminal is shorter in length than that of the PGA type, so that the inductance component is decreased, and the information processing speed is increased, and high speed processing of information is made possible.

On the other hand, recently, in association with wide spread use of portable information terminals, there is an increasing demand for miniaturization and high density assembly of a semiconductor device. Therefore, recently, a CSP (chip scale package) having a package size that is almost equal to the chip size has been developed; and, for example, various types of CSPs are disclosed in "Nikkei Microelement" (pp. 38-64) issued by Nikkei BP, Ltd. (February 1998). CSPs disclosed in this publication are manufactured in such a way that semiconductor elements cut into pieces are bonded onto a polyimide or ceramics substrate on which a wiring layer is formed, and then the wiring layer and semiconductor elements are electrically connected, such as by wire bonding, single point bonding, gang bonding, or bump bonding, and the connections are sealed with resin, after which external terminals such as solder bumps are formed thereon.

In Japanese Patent Application Laid-Open 9-232256 and Japanese Patent Application Laid-Open 10-27827, methods for mass-producing CSPs are disclosed. These manufacturing methods form bumps on a semiconductor wafer, electrically connect a wiring substrate via the bumps, seal the connections with resin, form external electrodes on the wiring substrate, and finally cut the semiconductor wafer into pieces, thus producing individual semiconductor devices. Furthermore, "Nikkei Microelement" (p. 164 to p. 167) issued by Nikkei BP, Ltd. (April 1998) discloses another manufacturing method for mass-producing CSPs. This manufacturing method forms bumps by plating on a semiconductor wafer, seals the part other than the bumps with resin, forms external electrodes in the bumps, then cuts the semiconductor wafer into pieces, thus producing individual semiconductor devices. In addition, Japanese Patent Application Laid-Open 10-92865 discloses a semiconductor device of a type in which a resin layer for cushioning stress is installed between external electrodes and semiconductor elements. Individual semiconductor devices are manufactured by processing units of semiconductor wafers in a batch and finally cutting each semiconductor wafer into pieces.

The aforementioned semiconductor devices (semiconductor package) of the type in which a plurality of resin layers and external electrodes are formed in units of semiconductor wafers in a batch, and then each semiconductor wafer is cut (diced) into pieces, has a constitution such that the interfaces of a plurality of resin layers sequentially formed on each semiconductor wafer are exposed on the end face of each semiconductor package, so that when a large mechanical stress is applied to the interfaces of the plurality of resin layers at the time of dicing of the semiconductor wafer, or when a large thermal stress is applied to the interfaces of the plurality of resin layers due to sudden temperature changes at the time of mounting of the semiconductor package, the stress is centralized to the interfaces between the semiconductor element exposed on the end face of the semiconductor package and the plurality of resin layers, so that one or more of the plurality of resin layers are peeled off and the semiconductor package may be damaged.

As mentioned above, such a known semiconductor device cannot always exhibit high reliability, and it is difficult to obtain a high manufacturing yield rate.

The present invention was developed in view of the foregoing technical background and is intended to provide a semiconductor device, and a method of manufacture thereof, having high reliability and a satisfactory manufacturing yield rate, such that the constituent part to which a concentrated stress is applied at the time of cutting of a semiconductor wafer and at the time of mounting of a semiconductor device is improved so as to withstand the stress, whereby the occurrences of damage of the semiconductor devices due to applied stress are greatly reduced.

To accomplish the above object, the semiconductor device of the present invention has semiconductor elements obtained by cutting a semiconductor wafer, having an integrated circuit and an electrode pad formed on one side thereof, along a cutting scribe line; a stress cushioning layer installed on the semiconductor elements; a lead wire portion extending from the electrode pad to the top of the stress cushioning layer through an opening formed in the stress cushioning layer on the electrode pad; external electrodes arranged on the lead wire portion on the top of the stress cushioning layer; and a conductor protective layer installed on the stress cushioning layer, excluding the external electrode arranged portion; and a conductor portion. The stress cushioning layer, lead wire portion, conductor protective layer, and external electrodes have a means for forming each end face on the end surface of the semiconductor elements inside the cutting scribe line and exposing the range from the end face on the end surface of the semiconductor elements to the inside of the scribe line.

To accomplish the above object, the semiconductor device of the present invention has semiconductor elements obtained by cutting a semiconductor wafer, having an integrated circuit and an electrode pad formed on one side thereof, along the cutting scribe line; a semiconductor element protective layer installed on the semiconductor elements; a stress cushioning layer installed on the semiconductor element protective layer; a first opening formed in the semiconductor element protective layer on the electrode pad; a second opening formed in the stress cushioning layer on the electrode pad; a lead wire portion extending to the top of the stress cushioning layer through the first opening and second opening, respectively, from the electrode pad; external electrodes arranged on the lead wire portion on the top of the stress cushioning layer; and a conductor protective layer installed on the stress cushioning layer, excluding the external electrode arranged portion, and on the conductor portion. The semiconductor element protective layer, stress cushioning layer, lead wire portion, conductor protective layer, and external electrodes have a means for forming each end face on the end surface of the semiconductor elements inside the cutting scribe line and exposing the range from the end face on the end surface of the semiconductor elements to the inside of the scribe line.

To accomplish the above object, the semiconductor device manufacturing method of the present invention has a first step of forming a plurality of semiconductor elements having an integrated circuit and an electrode pad on the circuit forming surface of a semiconductor wafer; a second step of forming a stress cushioning layer on a plurality of semiconductor elements; a third step of forming an opening in the electrode pad of the stress cushioning layer and forming a notch wider than the width of the scribe line in the stress cushioning layer on the cutting scribe line of the semiconductor wafer; a fourth step of forming a lead wire portion extending from the electrode pad to the stress cushioning layer via the opening; a fifth step of forming a conductor protective layer which covers the stress cushioning layer and lead wire portion and has an external electrode connection window portion on the lead wire portion and a notch at the position corresponding to the notch of the stress cushioning layer; a sixth step of forming an external electrode in the external electrode connection window portion; and a seventh step of cutting the semiconductor wafer along the cutting scribe line, thereby obtaining a plurality of semiconductor devices in minimum units.

To accomplish the above object, the semiconductor device manufacturing method of the present invention has a first step of forming a plurality of semiconductor elements having an integrated circuit and an electrode pad on the circuit forming surface of a semiconductor wafer; a second step of forming a semiconductor element protective layer on a plurality of semiconductor elements; a third step of forming a first opening in the electrode pad of the semiconductor element protective layer and forming a notch wider than the width of the scribe line in the semiconductor element protective layer on the cutting scribe line of the semiconductor wafer; a fourth step of forming a stress cushioning layer on the semiconductor element protective layer; a fifth step of forming a second opening in the electrode pad of the stress cushioning layer and forming a notch at the position corresponding to the notch of the semiconductor element protective layer in the stress cushioning layer on the cutting scribe line of the semiconductor wafer; a sixth step of forming a lead wire portion extending from the electrode pad to the stress cushioning layer via the first and second openings; a seventh step of forming a conductor protective layer, which covers the stress cushioning layer and lead wire portion and has an external electrode connection window portion on the lead wire portion and a notch at the position corresponding to the notch of the stress cushioning layer; an eighth step of forming an external electrode in the external electrode connection window portion; and a ninth step of cutting the semiconductor wafer along the cutting scribe line, thereby obtaining a plurality of semiconductor devices in minimum units.

According to each feature mentioned above, each end face of the stress cushioning layer and conductor protective layer, or each end face of the semiconductor element protective layer, stress cushioning layer, and conductor protective layer in the end face area of each semiconductor element, is formed so as to be positioned inside the semiconductor wafer cutting scribe line and exposed within the range from the end face of each semiconductor element to the inside of the scribe line, so that when a semiconductor wafer is to be cut along the semiconductor wafer cutting scribe line, the semiconductor wafer can be cut by surely recognizing the positioning marks located on the semiconductor wafer, whereby defective semiconductor packages due to a displacement of the cutting position of each obtained semiconductor device can be eliminated.

Further, according to each feature mentioned above, when each semiconductor device is to be obtained by cutting a semiconductor wafer, the cut portion of each semiconductor device is formed to have a single-layer structure only of a semiconductor element; and, even if mechanical stress is generated at the time of cutting of the semiconductor wafer, the mechanical stress is just applied to the single-layer structure, so that a plurality of resin layers will not be peeled off by the mechanical stress.

Furthermore, according to each feature mentioned above, when each semiconductor device is to be mounted, even if thermal stress is generated due to great changes in the environmental temperature and the thermal stress is applied to a plurality of resin layers, a large mechanical stress is not applied to the plurality of resin layers when the semiconductor wafer is cut, so that the plurality of resin layers are hardly damaged, with the result that none of the plurality of resin layers will be peeled off or very little peeling will occur due to thermal stress.

As mentioned above, according to each feature mentioned above, the semiconductor devices will not be damaged at all or very little damage will occur due to application of mechanical stress and thermal stress, so that the reliability of the semiconductor devices can be enhanced, and the production yield rate of the semiconductor devices can be increased.

DETAILED DESCRIPTION OF THE INVENTION

The embodiments of the semiconductor device and manufacturing method thereof of the present invention will be explained hereunder with reference to the accompanying drawings.

Figure 1:
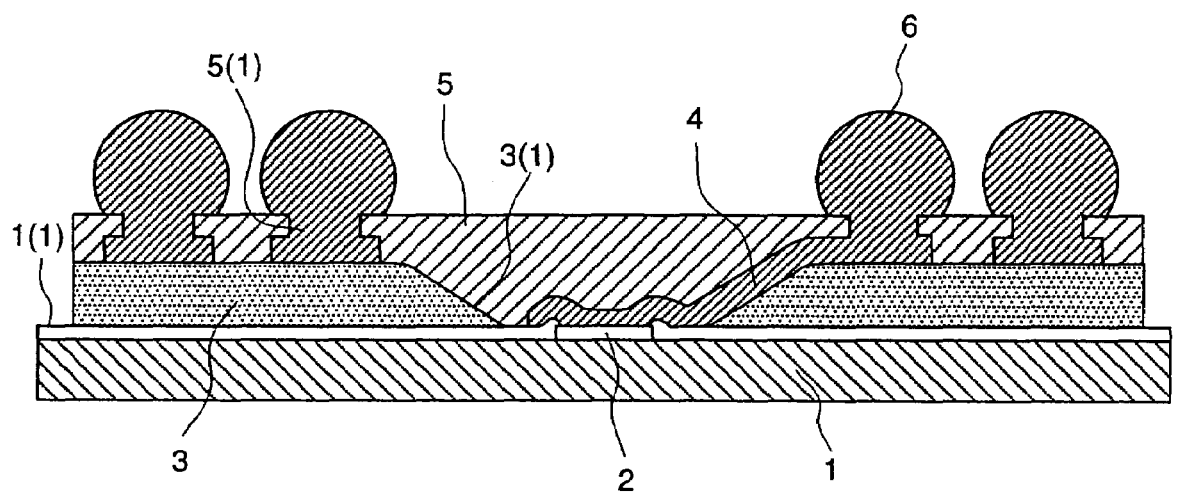
FIG. 1 is cross sectional view showing the constitution of a typical section of the semiconductor device according to a first embodiment of the present invention.
Figure 38:
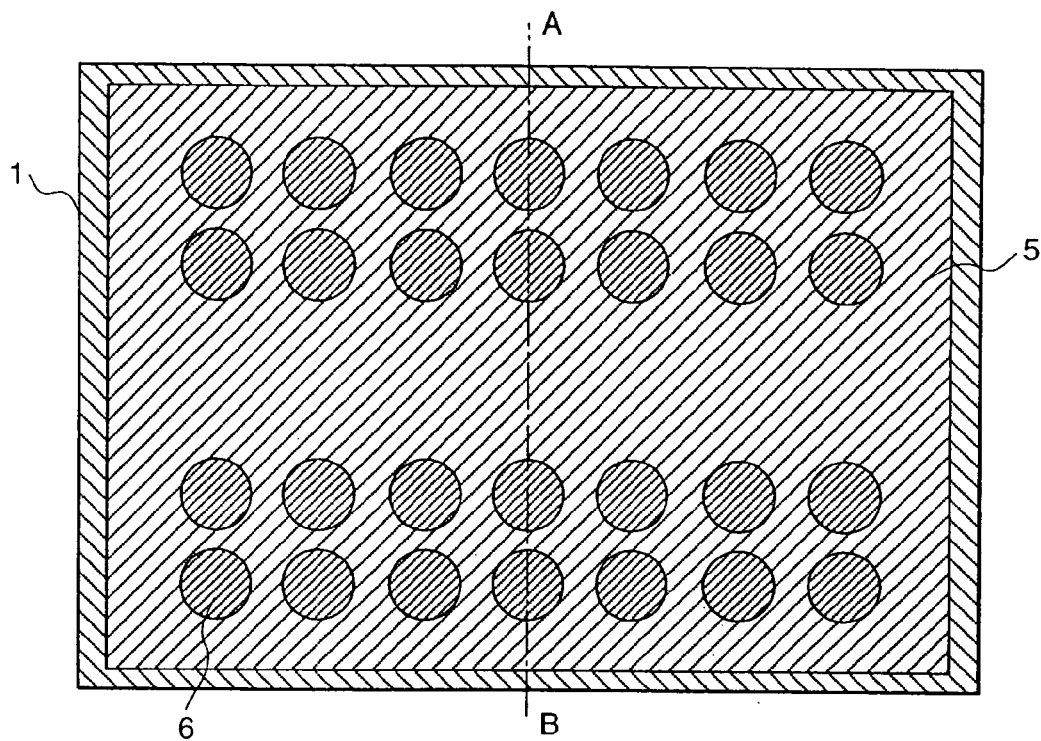
FIG. 38 is a view showing a semiconductor device according to first, third, forth, sixth, seventh and ninth embodiments of this invention and illustrates the structure of its substantial part.

FIG. 1 is a cross sectional view showing the constitution of a typical section of the semiconductor device according to a first embodiment of the present invention. Also, FIG. 38 is a view showing a semiconductor device according to a first embodiment of this invention and illustrates the structure of its substantial part. Further, FIG. 1 shows a sectional view taken along lines A-B in FIG. 38.

In FIG. 1 and FIG. 38, numeral 1 indicates a semiconductor element, 1(1) denotes an exposed end face of the semiconductor element 1, 2 denotes an electrode pad, 3 denotes a stress cushioning layer, 3(1) denotes an opening formed in the stress cushioning layer 3, 4 denotes a lead wire portion, 5 a conductor protective layer, 5(1) denotes a plurality of windows installed in the conductor protective layer 5, and 6 denotes an external electrode.

The semiconductor element 1 has the electrode pad 2 and an integrated circuit portion, which is not shown in the drawing, which are arranged on one side thereof; and, the semiconductor element 1 has an exposed end face 1(1). The stress cushioning layer 3 is formed on one side of the semiconductor element 1 and has an opening 3(1) above the electrode pad 2 and a slit (no drawing No. is assigned) extending to the bottom on the end face 1(1). The lead wire portion 4 is formed within the range from the electrode pad 2 along a part of the stress cushioning layer 3 within the opening 3(1). The conductor protective layer 5 is formed on the stress cushioning layer 3, including the lead wire portion 4, and has a plurality of windows 5(1) on a part of the lead wire portion 4; and a slit (no drawing No. is assigned) extends to the bottom of the conductor protective layer 5 at the position corresponding to the slit of the stress cushioning layer 3 on the end face 1(1). The external electrodes 6 are arranged on the lead wire portion 4 via each of the window portions 5(1).

In this case, the end face of the stress cushioning layer 3 formed by the slit and the end face of the conductor protective layer 5 obtained by forming the slit are positioned on the same surface, and the exposed end face 1(1) is formed within the range from the end face of the semiconductor element 1 to the end face of the stress cushioning layer 3 and the end face of the conductor protective layer 5 positioned on the same surface. The end face of the stress cushioning layer 3 and the end face of the conductor protective layer 5 are positioned slightly inside the cutting scribe line formed on a semiconductor wafer (not shown in the drawing) which will be described later.

Next, the semiconductor device manufacturing method according to the first embodiment will be described. A plurality of semiconductor devices are manufactured at the same time by cutting a semiconductor wafer; and, on the semiconductor wafer, positioning marks (not shown in the drawing) are formed at the intersections of the scribe lines, which constitute a cutting portion. Semiconductor devices are formed, respectively, on one side of the semiconductor wafer enclosed by the positioning marks, and then the semiconductor wafer is cut along the positioning marks, whereby a plurality of semiconductor devices are manufactured.

Firstly, positioning marks made of aluminum (Al) indicating an intersection of scribe lines are formed on one side of a semiconductor wafer made of silicon (Si); and, in the areas enclosed by the positioning marks, the electrode pads 2 of aluminum (Al) are formed. Then, and an integrated circuit portion (not shown in the drawing) is formed thereon.

Next, on the one side of the semiconductor wafer on which the positioning marks and electrode pads 2 are formed, the stress cushioning layer 3, including the opening 3(1) having a gently-inclined rising portion, is formed using a mask printing method. In this case, the printing mask to be used by the mask printing method has the same structure as that of the printing mask used for solder paste printing in a printed circuit board, and a so-called contact print for positioning and closely adhering a semiconductor wafer pattern and a printing mask and executing squeeze printing in this state is used. During printing, the whole squeeze surface of the printing mask is coated with paste at the first squeezing, and the opening of the printing mask is filled at the second squeezing, after which excessive paste is removed, and then the printing mask is removed from the semiconductor wafer, and the mask print is completed. Thereafter, the semiconductor wafer with paste print-coated thereon is heated stepwise using a hot plate or a heating oven, and the print-coated paste is hardened, whereby the stress cushioning layer 3 having the opening 3(1) is formed.

The material to be used to form the stress cushioning layer 3 is a pasty polyimide material and is hardened by heating after print-coating. The pasty polyimide material has satisfactory print-coating characteristics, such as a viscosity of 530 Pa-s and a thixotropy factor of 2.8. When such a pasty polyimide material is used, the wetting spread is made smaller, so that the stress cushioning layer 3 having the opening 3(1) as shown in FIG. 1 can be formed. When a stress cushioning layer 3 having a necessary thickness cannot be obtained by one mask printing, by repeating print-coating and hardening of the coated material several times, a predetermined thickness can be obtained.

In this case, when a pasty polyimide material is used to form the stress cushioning layer 3 and a metal mask with a thickness of 65 μm is used as a printing mask, by print-coating and hardening the coated material two times, a stress cushioning layer 3 with a thickness of 50 μm can be obtained. The hardening conditions in this case are sure that the material is print-coated at first, heated on a hot plate at 100° C. for 10 minutes, heated and hardened at 150° C. for 10 minutes, then print-coated again, heated on the hot plate at 200° C. for 25 minutes, and then heated and hardened in a thermostatic chamber at 250° C. for 60 minutes.

In the first embodiment, the stress cushioning layer 3 is formed using a pasty polyimide material. However, any low elastic resin material which can ensure the viscoelastic characteristics necessary for mask printing and withstand this manufacturing process from the viewpoint of the characteristics may be used.

Next, a scribe line with a width of 200 µm formed on a semiconductor wafer by laser processing using a carbon dioxide laser is exposed. In this case, a slit with a width of 400 µm reaching the bottom of the stress cushioning layer 3 is formed in the stress cushioning layer 3 at the end surface 1(1) and the positioning marks of the semiconductor wafer formed on the end surface 1(1) are exposed via this slit.

Then, a chromium (Cr) film with a thickness of 500 A is deposited on the stress cushioning layer 3, including the electrode pad 2 and a copper (Cu) film with a thickness of 0.5 µm is deposited on it. A negative type photosensitive resist is spin-coated on the obtained deposited film, prebaked, exposed, and developed, and a resist wiring pattern with a thickness of 15 µm is formed. A copper (Cu) film with a thickness of 10 µm is formed by electroplating inside the formed wiring pattern, and a nickel (Ni) film with a thickness of 2 µm is formed on it by electroplating. Thereafter, the resist is peeled off using a release liquid, and the copper (Cu) film among the deposited films is etched by an ammonium persulfate/sulfuric acid series solution; and, furthermore, the chromium (Cr) film among the deposited films is etched by a potassium permanganate series solution, and the lead wire portion 4 is formed.

When the lead wire portion 4 formed at this point of time was evaluated as to its suitability, no unsuitable (defective) lead wire portions were found at all among all the evaluated ones.

Next, the stress cushioning layer 3 including the lead wire portion 4 is coated with photosensitive solder resist varnish by screen printing, and the coated film is dried at 80° C. for 20 minutes, exposed and developed using a predetermined pattern, and heated and hardened at 150° C. for one hour, and the conductor protective layer 5 is formed. The formed conductor protective layer 5 has a plurality of window portions 5(1) on a part of the lead wire portion 4 and a slit (no drawing number is assigned) reaching the bottom of the conductor protective layer 5 at the position coinciding with the slit forming position of the stress cushioning layer 3 on the scribe line.

Next, a gold (Au) plating film having a thickness of 0.1 µm is formed by replacement plating on the nickel (Ni) film of the lead wire portion 4, which is exposed via the windows 5(1). Thereafter, flux is coated on the gold (Au) plating film using a metal mask, and solder balls of Sn—Ag—Cu series with a diameter of about 0.35 mm are put on it; and, the solder balls are heated in an infrared reflow furnace at 260° C. for 10 seconds, whereby the external electrodes 6 are formed.

Finally, by checking the positioning marks formed on the end surface 1(1) of the semiconductor element 1, that is, on the semiconductor wafer by transmission, the semiconductor wafer is cut by a dicing saw having a thickness of 0.2 mm along the scribe line, whereby a plurality of semiconductor devices are manufactured.

The semiconductor devices of the first embodiment manufactured by this method were subjected to an appearance inspection immediately after dicing, and it was found that the end area of the semiconductor element 1, including the plural-layer forming portion, was not damaged at all during dicing, so that there were no defective semiconductor packages produced at all.

Samples of a predetermined number were extracted from the semiconductor devices of the first embodiment manufactured in this way, and a temperature test was executed for each of the extracted samples in which a temperature cycle of conditioning at −55° C. for 10 minutes and conditioning at 125° C. for 10 minutes is repeated 1000 times. Each sample was subjected to appearance inspection after the temperature test was executed, and it was found that the plural-layer forming portion of the end area of the semiconductor element 1 was not damaged during dicing. Thus, the interface of the plural-layer forming portion was not peeled off and no defective samples were generated at all.

Figure 2:
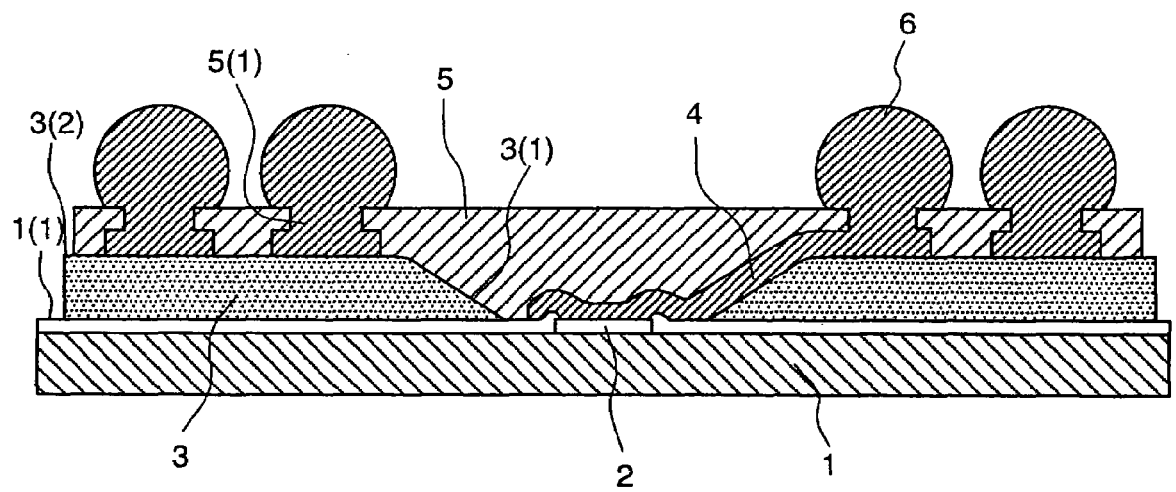
FIG. 2 is cross sectional view showing the constitution of a typical section of the semiconductor device according to a second embodiment of the present invention.
Figure 39:
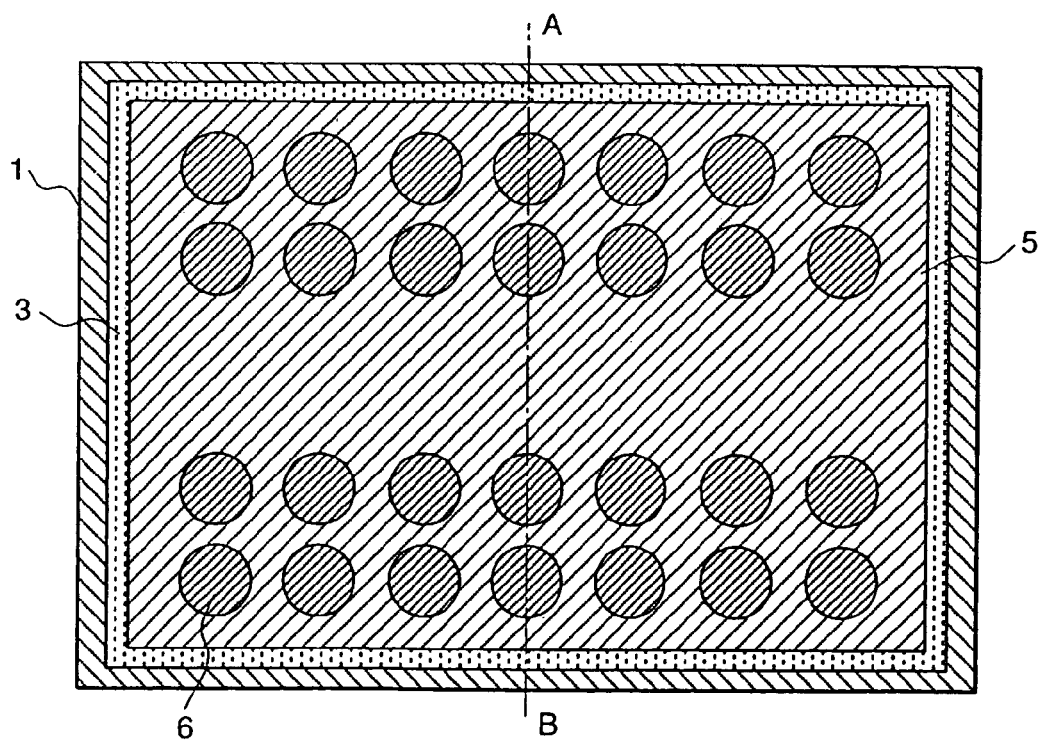
FIG. 39 is a view showing a semiconductor device according to second, fifth and eighth embodiments of this invention and illustrates the structure of its substantial part.

FIG. 2 is a cross sectional view showing the constitution of a typical section of the semiconductor device according to a second embodiment of the present invention. Also, FIG. 39 is a view showing a semiconductor device according to a second embodiment of this invention and illustrates the structure of its substantial part. Further, FIG. 2 shows a sectional view taken along lines A-B in FIG. 39.

In FIG. 2 and FIG. 39, numeral 3(2) indicates an exposed end surface of the stress cushioning layer 3 and with respect to the other numerals, the same numerals are assigned to each of the same components as those shown in FIG. 1.

The constituent difference between the aforementioned semiconductor device of the first embodiment (hereinafter referred to as the first embodiment device) and the semiconductor device of the second embodiment (hereinafter referred to as the second embodiment device) is only that, with respect to the constitution of the slit portion of the stress cushioning layer 3 on the end surface 1(1) of the semiconductor element 1 and the slit portion of the conductor protective layer 5, the first embodiment device is structured so that the end face of the stress cushioning layer 3 and the end face of the conductor protective layer 5 are located on the same plane, while the second embodiment device is structured so that the end face of the conductor protective layer 5 is displaced inwardly compared with the end face of the stress cushioning layer 3, and an exposed end surface 3(2) is located on the stress cushioning layer 3. There are no other constituent differences between the first embodiment device and the second embodiment device. Therefore, an additional explanation of the constitution of the second embodiment device will be omitted.

The method of manufacture of the second embodiment device is the same as that of the first embodiment device, so that an explanation of the method of manufacture of the second embodiment device will be also omitted.

The second embodiment device manufactured by such a method was carried out, it was also found that there were no defective samples at all.

Figure 3:
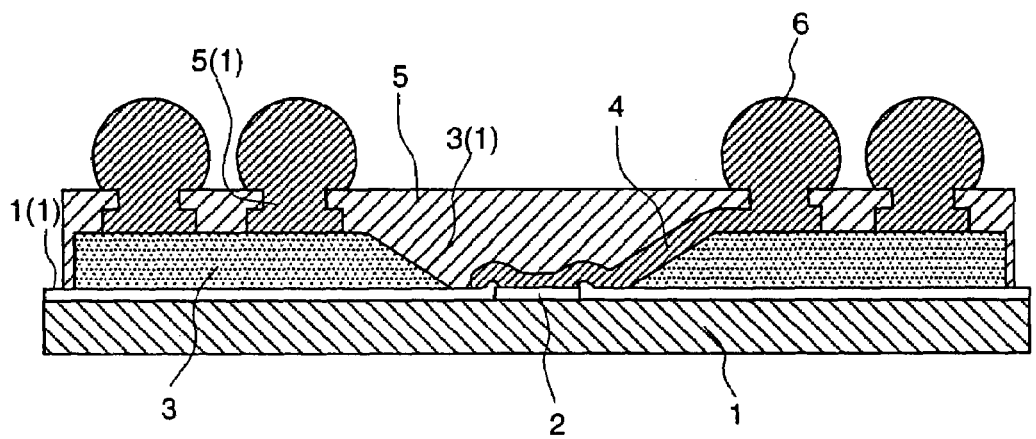
FIG. 3 is cross sectional view showing the constitution of a typical section of the semiconductor device of the third embodiment according to a present invention.

FIG. 3 is a cross sectional view showing the constitution of a typical section of the semiconductor device according to a third embodiment of the present invention. Also, FIG. 38 is a view showing a semiconductor device according to a third embodiment of this invention and illustrates the structure of its substantial part. Further, FIG. 3 shows a sectional view taken along lines A-B in FIG. 38.

In FIG. 3 and FIG. 38, the same numerals are assigned to each of the same components as those shown in FIG. 1.

The constituent difference between the aforementioned semiconductor device of the first embodiment (hereinafter referred to as the first embodiment device again) and the semiconductor device of the third embodiment (hereinafter referred to as the third embodiment device) is only that, with respect to the constitution of the slit portion of the stress cushioning layer 3 and the slit portion of the conductor protective layer 5 on the end surface 1(1) of the semiconductor element 1, the first embodiment device is structured so that the end face of the stress cushioning layer 3 and the end face of the conductor protective layer 5 are installed on the same plane, while the third embodiment device is structured so that the end face of the conductor protective layer 5 is positioned outside of and covers the end face of the stress cushioning layer 3 so that the outside part of the conductor protective layer 5 reaches the end surface 1(1). There are no other constituent differences between the first embodiment device and the third embodiment device. Therefore, additional explanation of the constitution of the third embodiment device will be omitted.

The method of manufacture of the third embodiment device is the same as that of the first embodiment device, so that an explanation of the method of manufacture of the third embodiment device will be omitted.

The third embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 4:
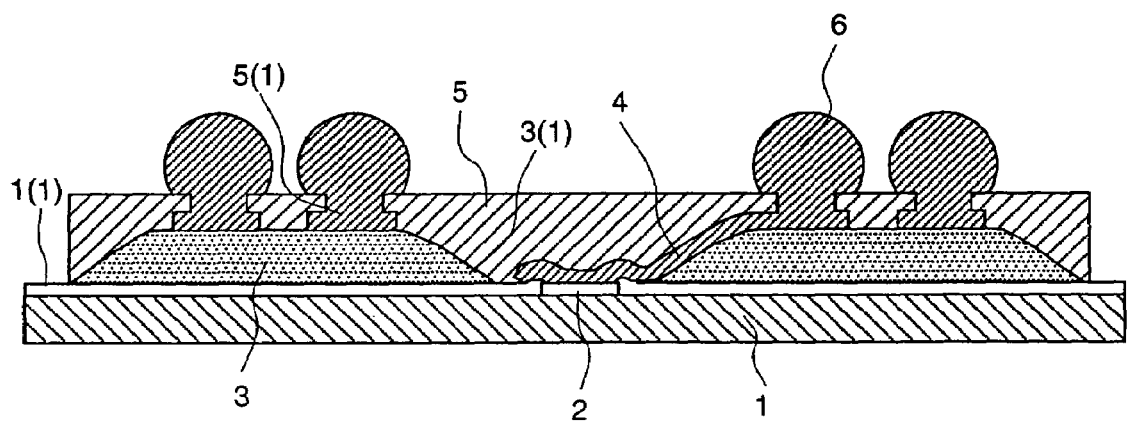
FIG. 4 is cross sectional view showing the constitution of a typical section of the semiconductor device according to a fourth embodiment of the present invention.

FIG. 4 is a cross sectional view showing the constitution of a typical section of the semiconductor device according to a fourth embodiment of the present invention. Also, FIG. 38 is a view showing a semiconductor device according to a forth embodiment of this invention and illustrates the structure of its substantial part. Further, FIG. 4 shows a sectional view taken along lines A-B in FIG. 38.

In FIG. 4 and FIG. 38, the same numerals are assigned to each of the same components as those shown in FIG. 1.

The constituent difference between the aforementioned semiconductor device of the first embodiment (hereinafter referred to as the first embodiment device again) and the semiconductor device of the fourth embodiment (hereinafter referred to as the fourth embodiment device) is only that, with respect to the constitution of the end area of the stress cushioning layer 3 and the end area of the conductor protective layer 5, the first embodiment device is structured so that a slit portion is formed in the stress cushioning layer 3, and a slit portion is also formed in the conductor protective layer 5, and their end faces are disposed on the same plane, while the fourth embodiment device is structured so that a tapered portion becoming thinner toward the end face is formed on the stress cushioning layer 3, and a slit portion is formed in the conductor protective layer 5, such that the end (end face) of the tapered portion and the end face of the slit portion are installed on the same plane, and the thickness of the conductor protective layer 5 compensates for changes in the thickness of the tapered portion. There are no other constituent differences between the first embodiment device and the fourth embodiment device. Therefore, additional explanation of the constitution of the fourth embodiment device will be omitted.

As compared with the method of manufacture of the first embodiment device, the manufacturing method of the fourth embodiment device has only a difference in that, with respect to the forming means of the stress cushioning layer 3, the manufacturing method of the first embodiment device forms the stress cushioning layer 3 including the opening 3(1) having a gently-inclined rising portion using the mask printing method and then forms a slit portion in the stress cushioning layer 3 by laser processing, while the manufacturing method of the fourth embodiment device forms the stress cushioning layer 3 including the opening 3(1) having a gently-inclined rising portion and a tapered portion becoming thinner toward the end face using the mask printing method and does not perform the subsequent laser processing for the stress cushioning layer 3. There are no other differences between the manufacturing method of the first embodiment device and the manufacturing method of the fourth embodiment device. Therefore, additional explanation of the manufacturing method of the fourth embodiment device will be omitted.

The fourth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 5:
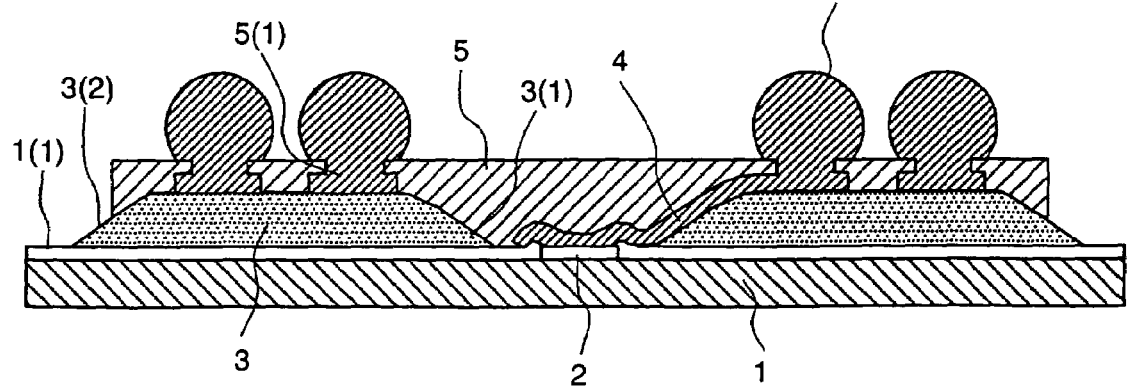
FIG. 5 is cross sectional view showing the constitution of a typical section of the semiconductor device according to a fifth embodiment of the present invention.

FIG. 5 is a cross sectional view showing the constitution of a typical section of the semiconductor device according to a fifth embodiment of the present invention. Also, FIG. 39 is a view showing a semiconductor device according to a fifth embodiment of this invention and illustrates the structure of its substantial part. Further, FIG. 5 shows a sectional view taken along lines A-B in FIG. 39.

In FIG. 5 and FIG. 39, the same numerals are assigned to each of the same components as those shown in FIGS. 2 and 4.

The constituent difference between the aforementioned semiconductor device of the fourth embodiment (hereinafter referred to as the fourth embodiment device again) and the semiconductor device of the fifth embodiment (hereinafter referred to as the fifth embodiment device) is only that with respect to the constitution of the end (end face) of the stress cushioning layer 3 and the end face of the conductor protective layer 5, the fourth embodiment device is structured so that the end (end face) of the stress cushioning layer 3 and the end face of the conductor protective layer 5 are disposed on the same plane, while the fifth embodiment device is structured so that the end face of the conductor protective layer 5 is shifted inwardly of the end (end face) of the stress cushioning layer 3, and an exposed end surface 3(2) is provided on the stress cushioning layer 3. There are no other constituent differences between the fourth embodiment device and the fifth embodiment device. Therefore, additional explanation of the constitution of the fifth embodiment device will be omitted.

The method of manufacture of the fifth embodiment device is the same as that of the fourth embodiment device, except that the mask printing method is used for forming the conductor protective layer 5 instead of the screen printing method. Thus, an explanation of the manufacturing method of the fifth embodiment device will be omitted.

The fifth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 6:
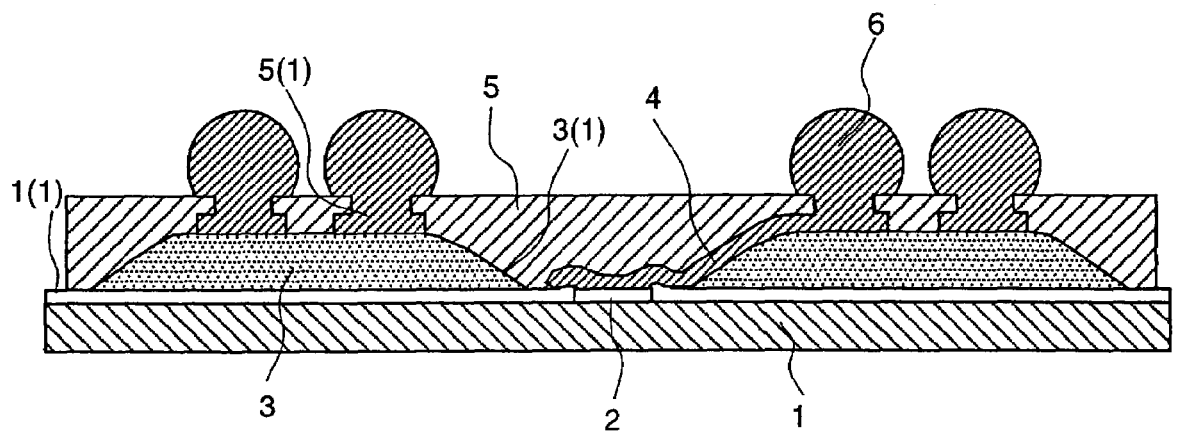
FIG. 6 is cross sectional view showing the constitution of a typical section of the semiconductor device according to a sixth embodiment of the present invention.

FIG. 6 is a cross sectional view showing the constitution of a typical section of the semiconductor device according to a sixth embodiment of the present invention. Also, FIG. 38 is a view showing a semiconductor device according to a sixth embodiment of this invention and illustrates the structure of its substantial part. Further, FIG. 6 shows a sectional view taken along lines A-B in FIG. 38.

In FIG. 6 and FIG. 38, the same numerals are assigned to each of the same components as those shown in FIG. 4.

The constituent difference between the aforementioned semiconductor device of the fourth embodiment (hereinafter referred to as the fourth embodiment device again) and the semiconductor device of the sixth embodiment (hereinafter referred to as the sixth embodiment device) is only that, with respect to the constitution of the end (end face) of the stress cushioning layer 3 and the end face of the conductor protective layer 5, the fourth embodiment device is structured so that the end (end face) of the stress cushioning layer 3 and the end face of the conductor protective layer 5 are disposed on the same plane, while the sixth embodiment device is structured so that the end face of the conductor protective layer 5 is positioned outside of and covers the end (end face) of the stress cushioning layer 3 so that the conductor protective layer 5 of the outside part reaches the end surface 1(1). There are no other constituent differences between the fourth embodiment device and the sixth embodiment device. Therefore, additional explanation of the constitution of the sixth embodiment device will be omitted.

The method of manufacture of the sixth embodiment device is the same as that of the fourth embodiment device, so that an explanation of the method of manufacture of the sixth embodiment device will be omitted.

The sixth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 7:
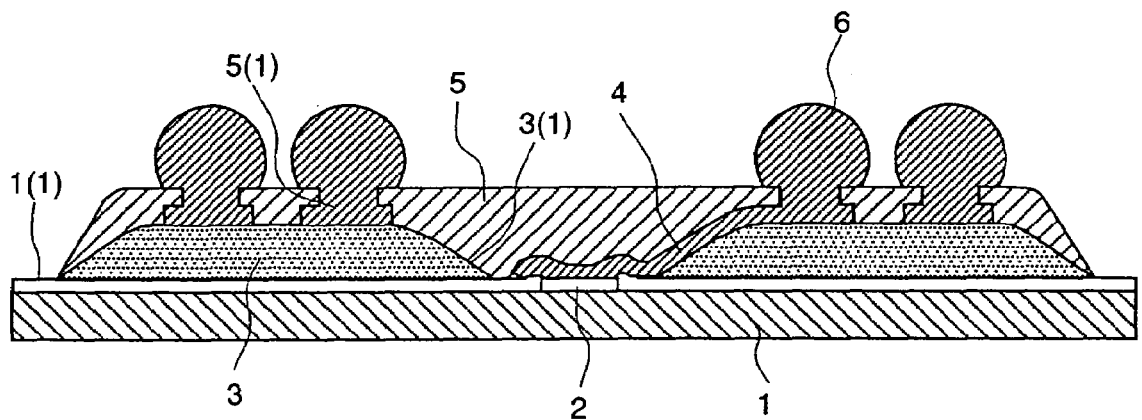
FIG. 7 is cross sectional view showing the constitution of a typical section of the semiconductor device according to a seventh embodiment of the present invention.

FIG. 7 is a cross sectional view showing the constitution of a typical section of the semiconductor device according to a seventh embodiment of the present invention. Also, FIG. 38 is a view showing a semiconductor device according to a seventh embodiment of this invention and illustrates the structure of its substantial part. Further, FIG. 7 shows a sectional view taken along lines A-B in FIG. 38.

In FIG. 7 and FIG. 38, the same numerals are assigned to each of the same components as those shown in FIG. 4.

The constituent difference between the aforementioned semiconductor device of the fourth embodiment (hereinafter referred to as the fourth embodiment device again) and the semiconductor device of the seventh embodiment (hereinafter referred to as the seventh embodiment device) is only that, with respect to the constitution of the end area of the conductor protective layer 5, the fourth embodiment device is structured so that a slit portion is formed in the conductor protective layer 5, and the end face of the conductor protective layer 5 is almost perpendicular to the end surface 1(1), while the seventh embodiment device is structured so that an inclined surface becoming thinner linearly toward the end face of the conductor protective layer 5 is formed. There are no other constituent differences between the fourth embodiment device and the seventh embodiment device. Therefore, additional explanation of the constitution of the seventh embodiment device will be omitted.

When the method of manufacture of the seventh embodiment device is compared with that of the fourth embodiment device, the difference is only that, with respect to the forming means of the conductor protectivelayer 5, the manufacturing method of the fourth embodiment device forms the conductor protective layer 5 including the opening 3(1) having a gently-inclined rising portion and a slit portion having an end face almost perpendicular to the end surface 1(1) using the screen printing method, while the manufacturing method of the seventh embodiment device forms the conductor protective layer 5 including the opening 3(1) having a gently-inclined rising portion and an inclined surface having a linearly-inclined rising portion using the mask printing method. There are no other differences between the manufacturing method of the fourth embodiment device and the manufacturing method of the seventh embodiment device. Therefore, additional explanation of the manufacturing method of the seventh embodiment device will be omitted.

The seventh embodiment device manufactured by such a method was evaluated as to its suitability immediately after forming the lead wire portion 4, and no unsuitable (defective) lead wire portions were found at all in all the evaluated devices. When the appearance inspection was performed immediately after dicing, it was found that there were no defective semiconductor packages at all, and when the same temperature test as that performed for the first embodiment device was carried out, it was also found that there were defective samples at all.

Figure 8:
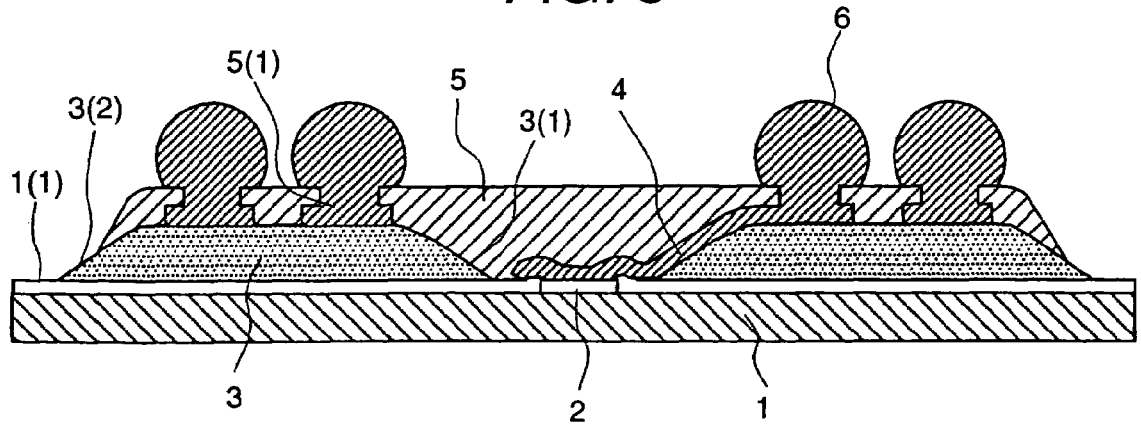
FIG. 8 is cross sectional view showing the constitution of a typical section of the semiconductor device according to a eighth embodiment of the present invention.

FIG. 8 is a cross sectional view showing the constitution of a typical section of the semiconductor device according to an eighth embodiment of the present invention. Also, FIG. 39 is a view showing a semiconductor device according to an eighth embodiment of this invention and illustrates the structure of its substantial part. Further, FIG. 8 shows a sectional view taken along lines A-B in FIG. 39.

In FIG. 8 and FIG. 39, the same numerals are assigned to each of the same components as those shown in FIGS. 5 and 7.

The constituent difference between the aforementioned semiconductor device of the seventh embodiment (hereinafter referred to as the seventh embodiment device again) and the semiconductor device of the eighth embodiment (hereinafter referred to as the eighth embodiment device) is only that, with respect to the constitution of the end (end face) of the stress cushioning layer 3 and the end (end face) of the conductor protective layer 5, the seventh embodiment device is structured so that the end (end face) of the stress cushioning layer 3 and the end (end face) of the conductor protective layer 5 are disposed on the same plane, while the eighth embodiment device is structured so that the end face of the conductor protective layer 5 is positioned inwardly of the end (end face) of the stress cushioning layer 3 so that an exposed end surface 3(2) is provided on the stress cushioning layer 3. There are no other constituent differences between the seventh embodiment device and the eighth embodiment device. Therefore, additional explanation of the constitution of the eighth embodiment device will be omitted.

The method of manufacture of the eighth embodiment device is the same as that of the seventh embodiment device, except that the screen printing method is used for forming the conductor protective layer 5 instead of the mask printing method. Thus, an explanation of the manufacturing method of the eighth embodiment device will be omitted.

The eighth embodiment device manufactured by such a method was evaluated as to its suitability immediately after forming the lead wire portion 4, and no unsuitable (defective) lead wire portions were found at all in all the evaluated devices. When an appearance inspection was executed immediately after dicing, it is found that there were no defective semiconductor packages at all, and when the same temperature test as that performed for the first embodiment device was carried out, it was found that there were no defective samples at all.

Figure 9:
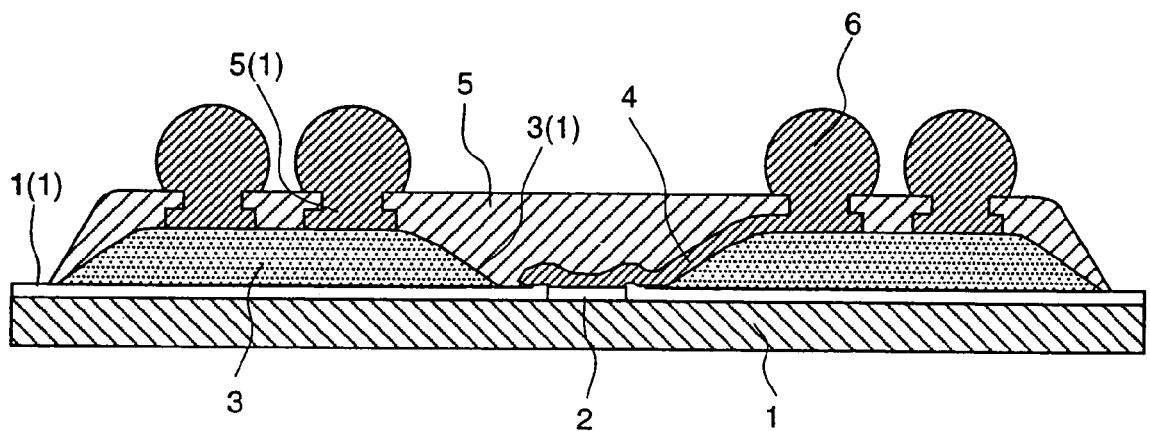
FIG. 9 is cross sectional view showing the constitution of a typical section of the semiconductor device according to a ninth embodiment of the present invention.

FIG. 9 is a cross sectional view showing the constitution of a typical section of the semiconductor device according to a ninth embodiment of the present invention. Also, FIG. 38 is a view showing a semiconductor device according to a ninth embodiment of this invention and illustrates the structure of its substantial part. Further, FIG. 9 shows a sectional view taken along lines A-B in FIG. 38.

In FIG. 9 and FIG. 38, the same numerals are assigned to each of the same components as those shown in FIG. 7.

The constituent difference between the aforementioned semiconductor device of the seventh embodiment (hereinafter referred to as the seventh embodiment device again) and the semiconductor device of the ninth embodiment (hereinafter referred to as the ninth embodiment device) is only that, with respect to the constitution of the end (end face) of the stress cushioning layer 3 and the end (end face) of the conductor protective layer 5, the seventh embodiment device is structured so that the end (end face) of the stress cushioning layer 3 and the end (end face) of the conductor protective layer 5 are disposed on the same plane, while the ninth embodiment device is structured so that the end face of the conductor protective layer 5 is positioned outside of and covers the end (end face) of the stress cushioning layer 3 so that the outside part of the conductor protective layer 5 reaches the end surface 1(1). There are no other constituent differences between the seventh embodiment device and the ninth embodiment device. Therefore, additional explanation of the constitution of the ninth embodiment device will be omitted.

The method of manufacture of the ninth embodiment device is the same as that of the seventh embodiment device, so that an explanation of the manufacturing method of the ninth embodiment device will be omitted.

The ninth embodiment device manufactured by such a method was evaluated as to its suitability immediately after forming the lead wire portion 4, and no unsuitable (defective) lead wire portions were found at all in all the evaluated devices. When the appearance inspection was performed immediately after dicing, it was found that there were no defective semiconductor packages at all, and when the same temperature test as that performed for the first embodiment device carried out, it was found that there were no defective samples at all.

Figure 10:
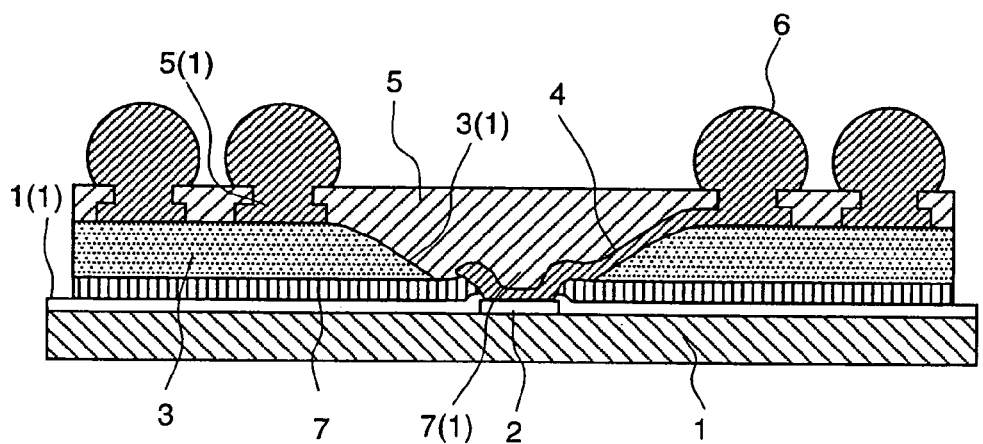
FIG. 10 is cross sectional view showing the constitution of a typical section of the semiconductor device according to a tenth embodiment of the present invention.
Figure 40:
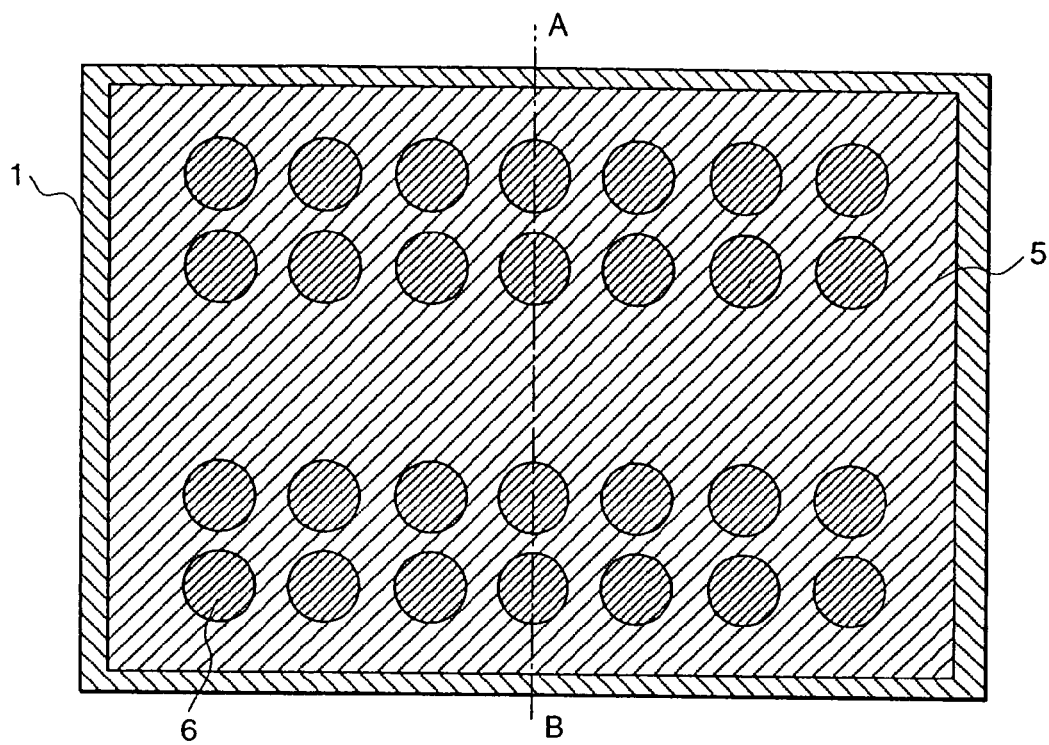
FIG. 40 is a view showing a semiconductor device according to tenth, fourteenth, sixteenth, seventeenth, eighteenth, twenty-second, twenty-sixth, twenty-eighth, twenty-ninth, thirtieth, thirty-second and thirty-third embodiments of this invention and illustrates the structure of its substantial part.

FIG. 10 is a cross sectional view showing the constitution of a typical section of the semiconductor device according to a tenth embodiment of the present invention. Also, FIG. 40 is a view showing a semiconductor device according to a tenth embodiment of this invention and illustrates the structure of its substantial part. Further, FIG. 10 shows a sectional view taken along lines A-B in FIG. 40.

In the following explanation, the semiconductor device of the tenth embodiment is referred to as the tenth embodiment device.

In FIG. 10 and FIG. 40, numeral 7 indicates a semiconductor element protective layer, and numeral 7(1) indicates an opening (first opening) formed in the semiconductor element protective layer 7. For the other elements, the same numerals are assigned to each of the same components as those shown in FIG. 1. In the following explanation, the opening 3(1) formed in the stress cushioning layer 3 in correspondence with the first opening 7(1) is assumed to be a second opening.

The semiconductor element protective layer 7 is formed on one side of the semiconductor element 1, where the electrode pad 2 and an integrated circuit portion, which are not shown in the drawing, are formed and arranged, and the first opening 7(1) is located above the electrode pad 2. A a slit portion reaching the bottom of the semiconductor element protective layer 7 extends to the end surface 1(1) of the semiconductor element 1. The stress cushioning layer 3 is formed on the semiconductor element protective layer 7, and the second opening 3(1) is located at a position corresponding to the first opening 7(1) on the electrode pad 2. A slit portion reaching the bottom of the stress cushioning layer 3 is installed on the end surface 1(1). The lead wire portion 4 is formed within the range from the electrode pad 2 to a part of the stress cushioning layer 3 via the first opening 7(1) and the second opening 3(1). The conductor protective layer 5 is formed on the stress cushioning layer 3, including the lead wire portion, and a plurality of windows 5(1) are formed in a part of the lead wire portion 4, with a slit portion reaching the bottom of the conductor protective layer 5 being formed on the end surface 1(1). The external electrodes 6 are formed and arranged on the lead wire portion 4 via the windows 5(1).

In this case, the end face of the semiconductor element protective layer 7 obtained by forming the slit portion, the end face of the stress cushioning layer 3 obtained by forming the slit portion, and the end face of the conductor protective layer 5 obtained by forming the slit portion are positioned on the same plane, and the exposed end surface 1(1) is formed within the range from the end face of the semiconductor element 1 to the end face of the semiconductor element protective layer 7, the end face of the stress cushioning layer 3, and the end face of the conductor protective layer 5, which are positioned on the same plane. The end face of the semiconductor element protective layer 7, the end face of the stress cushioning layer 3, and the end face of the conductor protective layer 5, which are disposed on the same plane, are positioned slightly inside a cutting scribe line formed on the semiconductor wafer.

The method of manufacture of the semiconductor device of the tenth embodiment will be described hereunder.

First, positioning marks made of aluminum (Al) indicating the intersection of scribe lines are formed on one side of a semiconductor wafer made of silicon (Si) or materials, and the electrode pads 2 of aluminum (Al) are formed respectively in the areas enclosed by the positioning marks. Then, an integrated circuit portion (not shown in the drawing) is formed and arranged thereon.

Next, on the one side of the semiconductor wafer on which the positioning marks and the electrode pads 2 are formed, negative photosensitive polyimide resin is coated by spin coating and the semiconductor wafer is dried on a hot plate at 75° C. for 105 seconds and then at 90° C. for 105 seconds. Then it is exposed using a predetermined mask, and heated again on the hot plate at 125° C. for 60 seconds, and then developed. Thereafter, the semiconductor wafer is heated and cured in a nitrogen ($N_2$) atmosphere at 350° C. for 60 seconds. The semiconductor element protective layer 7 having the opening 7(1) on the electrode pad 2 and the slit portion by which the end surface 1(1) of the semiconductor wafer 1 is exposed linearly as far as about 100 μm inside the end face of the semiconductor element 1 is formed.

Next, the aluminum (Al) oxide film is removed from the surface of the electrode pad 2 by sputter etching using argon (Ar) gas.

The process of forming the stress cushioning layer 3 to be installed on the semiconductor element protective layer 7 thereafter, the process of forming the lead wire portion 4 reaching a part of the stress cushioning layer 3 from the electrode pad 2 via the first opening 7(1) and the second opening 3(1), the process of forming the conductor protective layer 5 to be installed on the stress cushioning layer 3 including the lead wire portion 4, the process of forming the external electrodes 6 to be formed on the lead wire portion 4, and the process of cutting a semiconductor wafer are the same as the corresponding respective processes used in the method of manufacture of the first embodiment, so that additional explanation of the method of manufacture of the tenth embodiment semiconductor device will be omitted.

The tenth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 11:
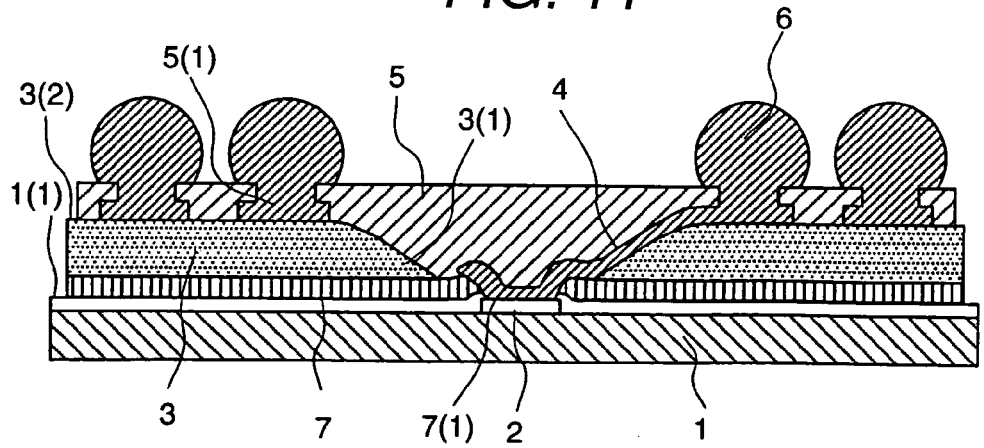
FIG. 11 is cross sectional view showing the constitution of a typical section of the semiconductor device according to a eleventh embodiment of the present invention.
Figure 41:
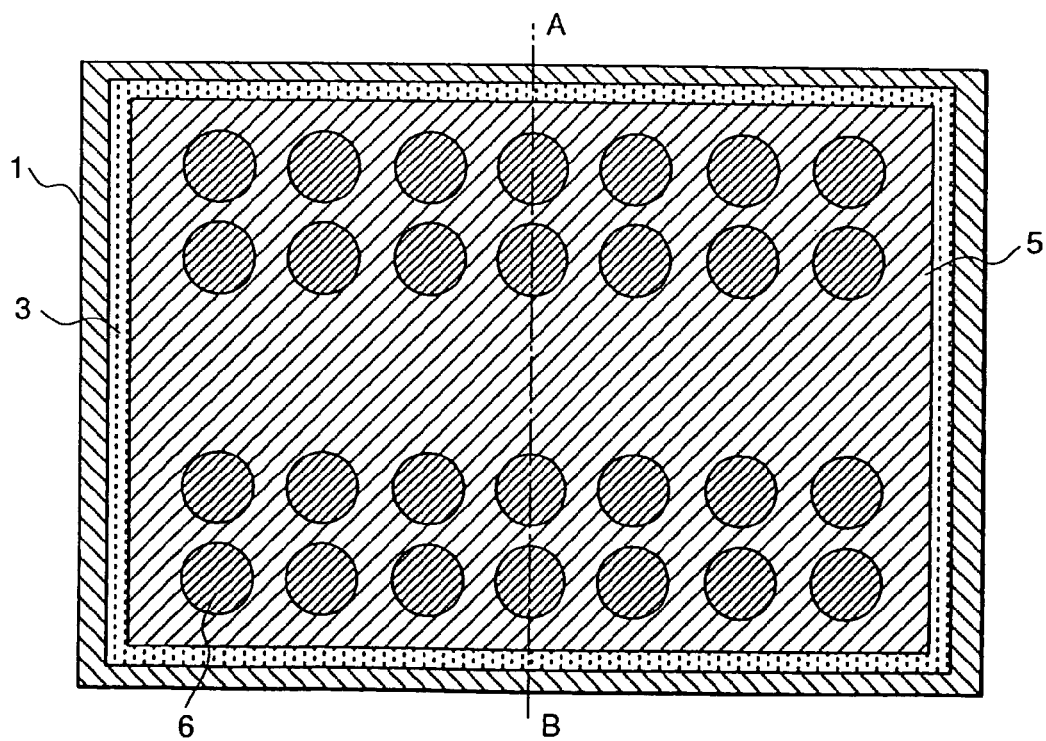
FIG. 41 is a view showing a semiconductor device according to eleventh, thirteenth, nineteenth, twenty-first, twenty-third and twenty-fifth embodiments of this invention and illustrates the structure of its substantial part.

FIG. 11 is a cross sectional view showing the constitution of a typical section of the semiconductor device according to an eleventh embodiment of the present invention. Also, FIG. 41 is a view showing a semiconductor device according to an eleventh embodiment of this invention and illustrates the structure of its substantial part. Further, FIG. 11 shows a sectional view taken along lines A-B in FIG. 41. In FIG. 11 and FIG. 41, the same numerals are assigned to each of the same components as those shown in FIGS. 1 and 2.

The constituent difference between the aforementioned semiconductor device of the tenth embodiment (hereinafter referred to as the tenth embodiment device again) and the semiconductor device of the eleventh embodiment (hereinafter referred to as the eleventh embodiment device) is only that, with respect to the constitution of the slit portions of the semiconductor element protective layer 7 and the stress cushioning layer 3 and the slit portion of the conductor protective layer 5 on the end surface 1(1) of the semiconductor element 1, the tenth embodiment device is structured so that the end face of the semiconductor element protective layer 7, the end face of the stress cushioning layer 3, and the end face of the conductor protective layer 5 are disposed on the same plane, while the eleventh embodiment device is structured so that the end face of the semiconductor element protective layer 7 and the end face of the stress cushioning layer 3 are positioned on the same plane, while the end face of the conductor protective layer 5 is positioned inwardly compared with the same plane, so that an exposed end surface 3(2) is provided on the stress cushioning layer 3. There are no other constituent differences between the tenth embodiment device and the eleventh embodiment device. Therefore, additional explanation of the constitution of the eleventh embodiment device will be omitted.

The method of manufacture of the eleventh embodiment device is the same as of the tenth embodiment device, so that an explanation on the method of manufacture of the tenth embodiment device will be omitted.

The eleventh embodiment device manufactured by such a method was evaluated as to its suitability immediately after forming the lead wire portion 4, and no unsuitable (defective) lead wire portions were found at all in all the evaluated ones. When an appearance inspection was performed immediately after dicing, it was found that there were no defective semiconductor packages at all, and when the same temperature test as that performed for the first embodiment device was carried out, it was found that there were no defective samples at all.

Figure 12:
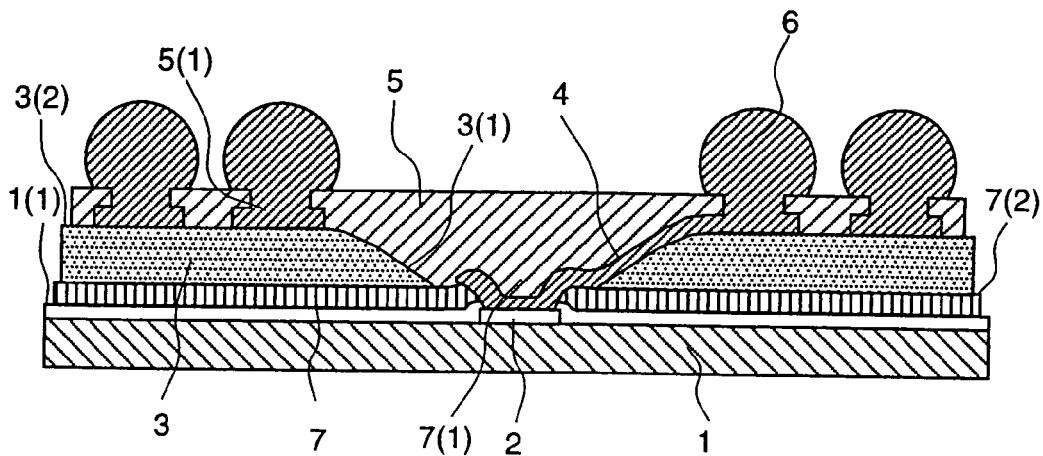
FIG. 12 is cross sectional view showing the constitution of a typical section of the semiconductor device according to a twelfth embodiment of the present invention.
Figure 42:
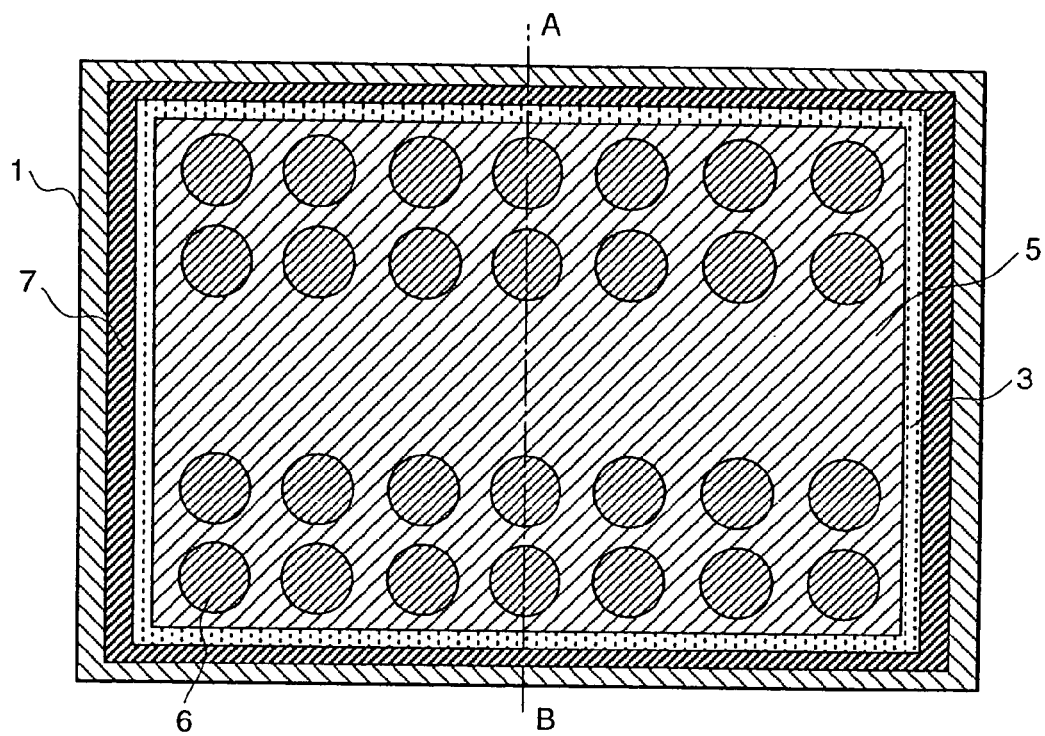
FIG. 42 is a view showing a semiconductor device according to twelfth, twentieth, twenty-forth and thirty-first embodiments of this invention and illustrates the structure of its substantial part.

FIG. 12 is a cross sectional view showing the constitution of a typical section of the semiconductor device according to an twelfth embodiment of the present invention. Also, FIG. 42 is a view showing a semiconductor device according to a twelfth embodiment of this invention and illustrates the structure of its substantial part. Further, FIG. 12 shows a sectional view taken along lines A-B in FIG. 42.

In FIG. 12 and FIG. 42, numeral 7(2) indicates an exposed end surface of the semiconductor element protective layer 7. For the other elements, the same numerals are assigned to each of the same components as those shown in FIG. 11.

The constituent difference between the aforementioned semiconductor device of the eleventh embodiment (hereinafter referred to as the first embodiment device again) and the semiconductor device of the twelfth embodiment (hereinafter referred to as the twelfth embodiment device) is only that, with respect to the constitution of the slit portion of the semiconductor element protective layer 7 and the slit portion of the stress cushioning layer 3 on the end surface 1(1) of the semiconductor element 1, the eleventh embodiment device is structured so that the end face of the semiconductor element protective layer 7 and the end face of the stress cushioning layer 3 are disposed on the same plane, while the twelfth embodiment device is structured so that the end face of the stress cushioning layer 3 is positioned inwardly compared with the end face of the semiconductor element protective layer 7, so that an exposed end surface 7(2) is provided on the semiconductor element protective layer 7. There are no other constituent differences between the eleventh embodiment device and the twelfth embodiment device. Therefore, additional explanation of the constitution of the twelfth embodiment device will be omitted.

The method of manufacture of the twelfth embodiment device is the same as that of the eleventh embodiment device, so that an explanation of the method of manufacture of the twelfth embodiment device will be omitted.

The twelfth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 13:
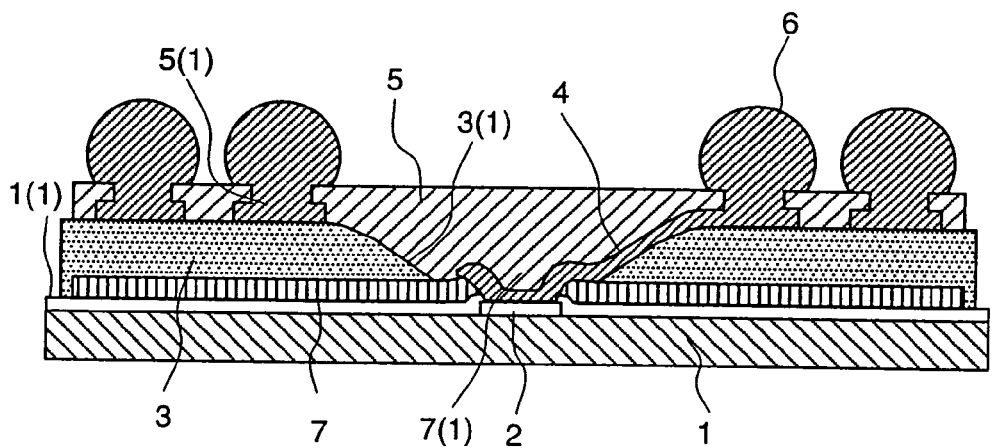
FIG. 13 is cross sectional view showing the constitution of a typical section of the semiconductor device according to a thirteenth embodiment of the present invention.

FIG. 13 is a cross sectional view showing the constitution of a typical section of the semiconductor device according to a thirteenth embodiment of the present invention. Also, FIG. 41 is a view showing a semiconductor device according to a thirteenth embodiment of this invention and illustrates the structure of its substantial part. Further, FIG. 13 shows a sectional view taken along lines A-B in FIG. 41.

In FIG. 13 and FIG. 41, the same numerals are assigned to each of the same components as those shown in FIG. 11.

The constituent difference between the aforementioned semiconductor device of the eleventh embodiment (hereinafter referred to as the eleventh embodiment device again) and the semiconductor device of the thirteenth embodiment (hereinafter referred to as the thirteenth embodiment device)

is only that, with respect to the constitution of the slit portion of the semiconductor element protective layer 7 and the slit portion of the stress cushioning layer 3 on the end surface 1(1) of the semiconductor element 1, the eleventh embodiment device is structured so that the end face of the semiconductor element protective layer 7 and the end face of the stress cushioning layer 3 are disposed on the same plane, while the thirteenth embodiment device is structured so that the end face of the stress cushioning layer 3 is positioned outside of and covers the end face of the semiconductor element protective layer 7, so that the stress cushioning layer 3 of the outside part reaches the end surface 1(1). There are no other constituent differences between the eleventh embodiment device and the thirteenth embodiment device. Therefore, additional explanation of the constitution of the thirteenth embodiment device will be omitted.

The method of manufacture of the thirteenth embodiment device is the same as that of the eleventh embodiment device, so that an explanation of the method of manufacture of the thirteenth embodiment device will be omitted.

The thirteenth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was also found that there were no defective samples at all.

Figure 14:
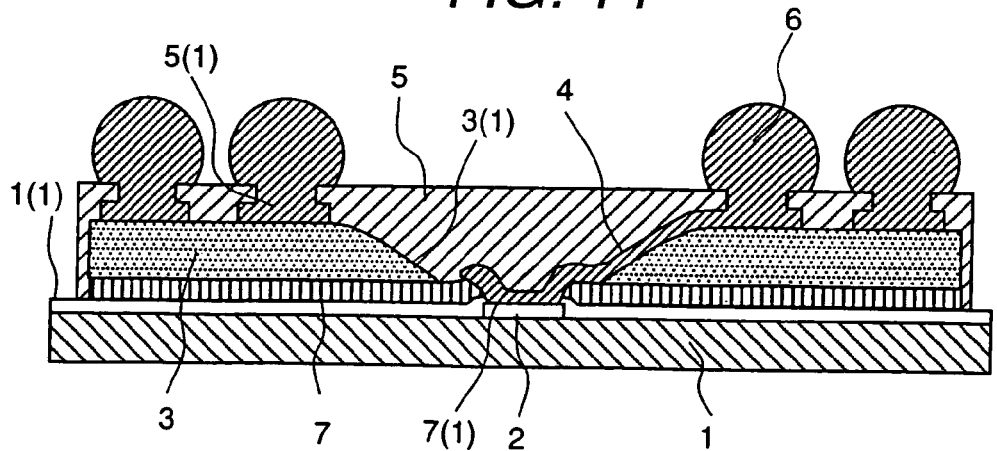
FIG. 14 is cross sectional view showing the constitution of a typical section of the semiconductor device according to a fourteenth embodiment of the present invention.

FIG. 14 is a cross sectional view showing the constitution of a typical section of the semiconductor device according to a fourteenth embodiment of the present invention. Also, FIG. 40 is a view showing a semiconductor device according to a fourteenth embodiment of this invention and illustrates the structure of its substantial part. Further, FIG. 14 shows a sectional view taken along lines A-B in FIG. 40.

In FIG. 14 and FIG. 40, the same numerals are assigned to each of the same components as those shown in FIG. 11.

The constituent difference between the aforementioned semiconductor device of the eleventh embodiment (hereinafter referred to as the eleventh embodiment device again) and the semiconductor device of the fourteenth embodiment (hereinafter referred to as the fourteenth embodiment device) is only that, with respect to the constitution of the slit portion of the stress cushioning layer 3, the slit portion of the semiconductor element protective layer 7 and the slit portion of the conductor protective layer 5 on the end surface 1(1) of the semiconductor element 1, the eleventh embodiment device is structured so that the end face of the semiconductor element protective layer 7 and the end face of the stress cushioning layer 3 are disposed on the same plane and the end face of the conductor protective layer 5 is positioned inwardly compared with this same plane, while the fourteenth embodiment device is structured so that the end face of the semiconductor element protective layer 7 and the end face of the stress cushioning layer 3 are disposed on the same plane, while the end face of the conductor protective layer 5 is positioned outside of this same plane so that the outside part of the conductor protective layer 5 reaches the end surface 1(1). There are no other constituent differences between the eleventh embodiment device and the fourteenth embodiment device. Therefore, additional explanation of the constitution of the fourteenth embodiment device will be omitted.

The method of manufacture of the fourteenth embodiment device is the same as that of the eleventh embodiment device, so that an explanation of the method of manufacture of the fourteenth embodiment device will be omitted.

The fourteenth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was also found that there were no defective samples at all.

Figure 15:
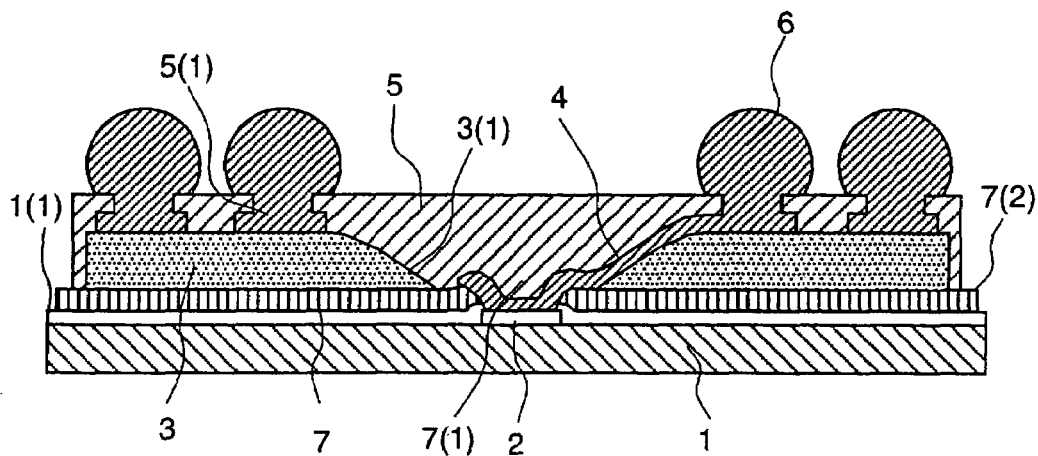
FIG. 15 is cross sectional view showing the constitution of a typical section of the semiconductor device according to a fifteenth embodiment of the present invention.
Figure 43:
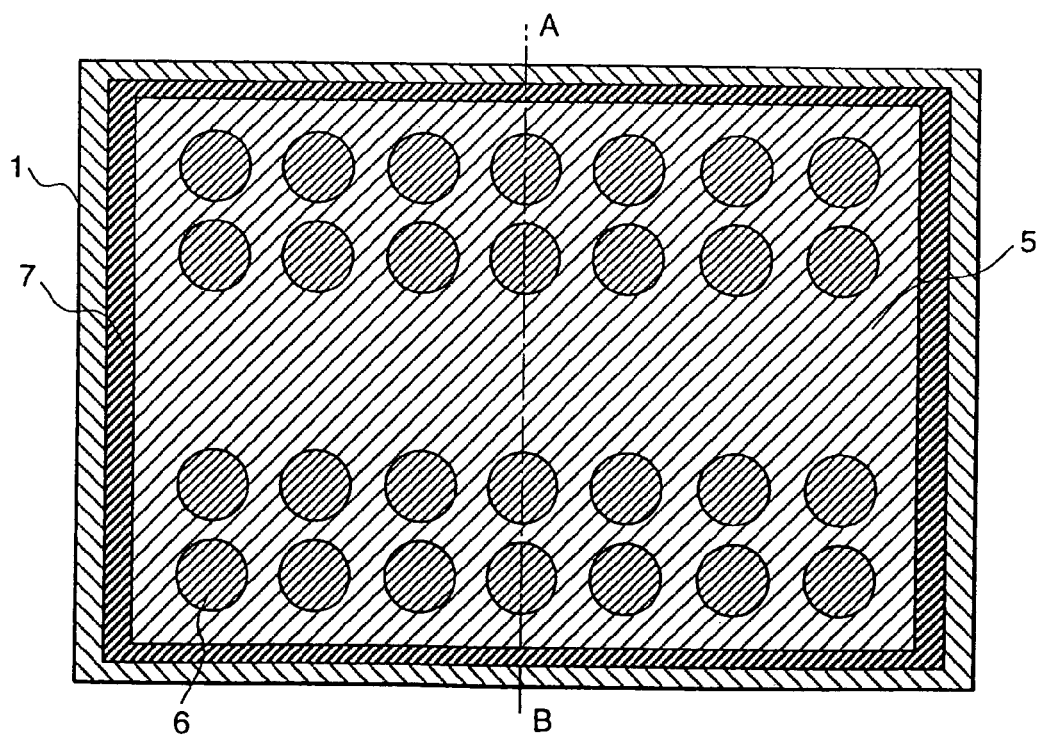
FIG. 43 is a view showing a semiconductor device according to fifteenth and twenty-seventh embodiments of this invention and illustrates the structure of its substantial part.

FIG. 15 is a cross sectional view showing the constitution of a typical section of the semiconductor device according to a fifteenth embodiment of the present invention. Also, FIG. 43 is a view showing a semiconductor device according to a fifteenth embodiment of this invention and illustrates the structure of its substantial part. Further, FIG. 15 shows a sectional view taken along lines A-B in FIG. 43.

In FIG. 15 and FIG. 43, the same are assigned to each of the same components as those shown in FIG. 12.

The constituent difference between the aforementioned semiconductor device of the twelfth embodiment (hereinafter referred to as the twelfth embodiment device again) and the semiconductor device of the fifteenth embodiment (hereinafter referred to as the fifteenth embodiment device) is only that, with respect to the constitution of the slit portion of the stress cushioning layer 3 and the slit portion of the conductor protective layer 5 on the end surface 1(1) of the semiconductor element 1, the twelfth embodiment device is structured so that the end face of the conductor protective layer 5 is positioned inwardly with respect to the end face of the stress cushioning layer 3, while the fifteenth embodiment device is structured so that the end face of the conductor protective layer 5 is positioned on the outside compared with the end face of the stress cushioning layer 3 and the outside part of the conductor protective layer 5 reaches the exposed end surface 7(2) of the semiconductor element protective layer 7. There are no other constituent differences between the twelfth embodiment device and the fifteenth embodiment device. Therefore, additional explanation of the constitution of the fifteenth embodiment device will be omitted.

The method of manufacture of the fifteenth embodiment device is the same as that of the twelfth embodiment device, so that the explanation of the manufacturing method of the fifteenth embodiment device will be omitted.

The fifteenth embodiment device manufactured by such a method was evaluated as to its suitability immediately after forming the lead wire portion 4, and no unsuitable (defective) lead wire portions were found at all in all the evaluated devices. When an appearance inspection was performed executed immediately after dicing, it was found that there were no defective semiconductor packages at all, and when the same temperature test as that performed for the first embodiment device was carried out, it was found that there were no defective samples at all.

Figure 16:
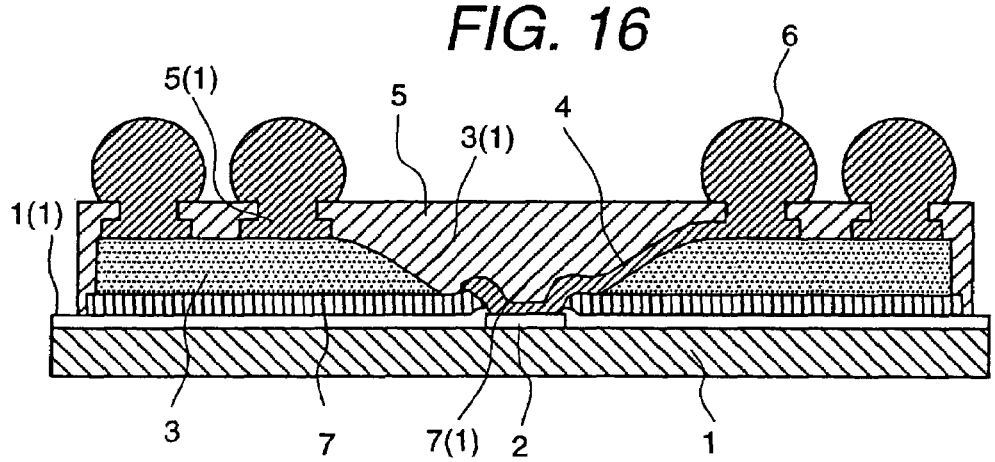
FIG. 16 is cross sectional view showing the constitution of a typical section of the semiconductor device according to a sixteenth embodiment of the present invention.

FIG. 16 is a cross sectional view showing the constitution of a typical section of the semiconductor device according to a sixteenth embodiment of the present invention. Also, FIG. 40 is a view showing a semiconductor device according to a sixteenth embodiment of this invention and illustrates the structure of its substantial part. Further, FIG. 16 shows a sectional view taken along lines A-B in FIG. 40.

In FIG. 16 and FIG. 40, the same numerals are assigned to each of the same components as those shown in FIG. 12.

The constituent difference between the aforementioned semiconductor device of the twelfth embodiment (hereinafter referred to as the twelfth embodiment device again) and the semiconductor device of the sixteenth embodiment (hereinafter referred to as the sixteenth embodiment device) is only that, with respect to the constitution of the slit portion of the semiconductor element protective layer 7, the slit portion of the stress cushioning layer 3 and the slit portion of the conductor protective layer 5 on the end surface 1(1) of the semiconductor element 1, the twelfth embodiment device is structured so that the end face of the conductor protective layer 5 is positioned inwardly compared with the end face of the stress cushioning layer 3, while the sixteenth embodiment device is structured so that the end face of the conductor protective layer 5 is positioned outside of the end face of the stress cushioning layer 3, and the end face of the semiconductor element protective layer 7 and the outside part of the conductor protective layer 5 reaches the exposed end surface 7(2) of the semiconductor element protective layer 7 and the end surface 1(1) of the semiconductor element 1. There are no other constituent differences between the twelfth embodiment device and the sixteenth embodiment device. Therefore, additional explanation of the constitution of the sixteenth embodiment device will be omitted.

The method of manufacture of the sixteenth embodiment device is the same as that of the twelfth embodiment device, so that an explanation of the method of manufacture of the sixteenth embodiment device will be omitted.

The sixteenth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was also found that there were no defective samples at all.

Figure 17:
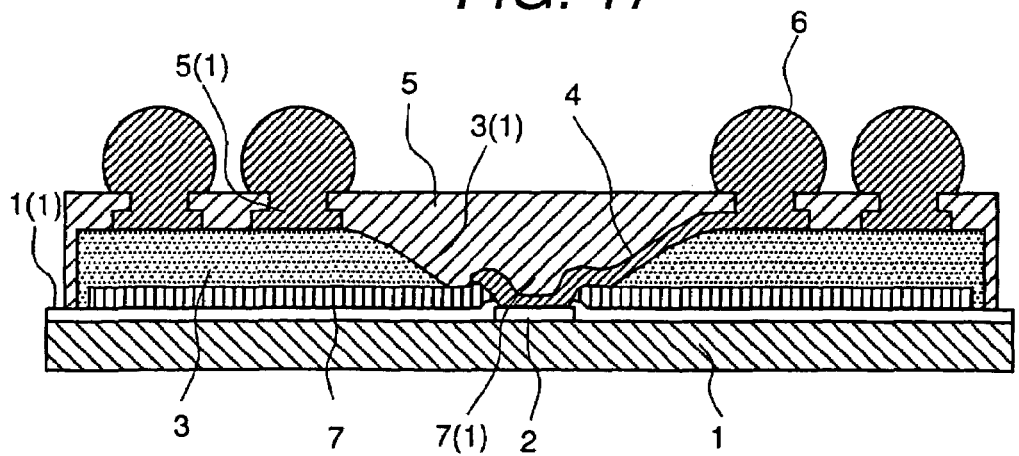
FIG. 17 is cross sectional view showing the constitution of a typical section of the semiconductor device according to a seventeenth embodiment of the present invention.

FIG. 17 is a cross sectional view showing the constitution of a typical section of the semiconductor device according to a seventeenth embodiment of the present invention. Also, FIG. 40 is a view showing a semiconductor device according to a seventeenth embodiment of this invention and illustrates the structure of its substantial part. Further, FIG. 17 shows a sectional view taken along lines A-B in FIG. 40.

In FIG. 17 and FIG. 40, the same numerals are assigned to each of the same components as those shown in FIG. 13. The constituent difference between the aforementioned semiconductor device of the thirteenth embodiment (hereinafter referred to as the thirteenth embodiment device again) and the semiconductor device of the seventeenth embodiment (hereinafter referred to as the seventeenth embodiment device) is only that, with respect to the constitution of the slit portion of the stress cushioning layer 3 and the slit portion of the conductor protective layer 5 on the end surface 1(1) of the semiconductor element 1, the thirteenth embodiment device is structured so that the end face of the conductor protective layer 5 is positioned inwardly compared with the end face of the stress cushioning layer 3, while the seventeenth embodiment device is structured so that the end face of the conductor protective layer 5 is positioned outside of the end face of the stress cushioning layer 3, and the outside part of the conductor protective layer 5 reaches the end surface 1(1) of the semiconductor element 1. There are no other constituent differences between the thirteenth embodiment device and the seventeenth embodiment device. Therefore, additional explanation of the constitution of the seventeenth embodiment device will be omitted.

The method of manufacture of the seventeenth embodiment device is the same as that of the thirteenth embodiment device, so that an explanation of the method of manufacture of the seventeenth embodiment device will be omitted.

The seventeenth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was also found that there were no defective samples at all.

Figure 18:
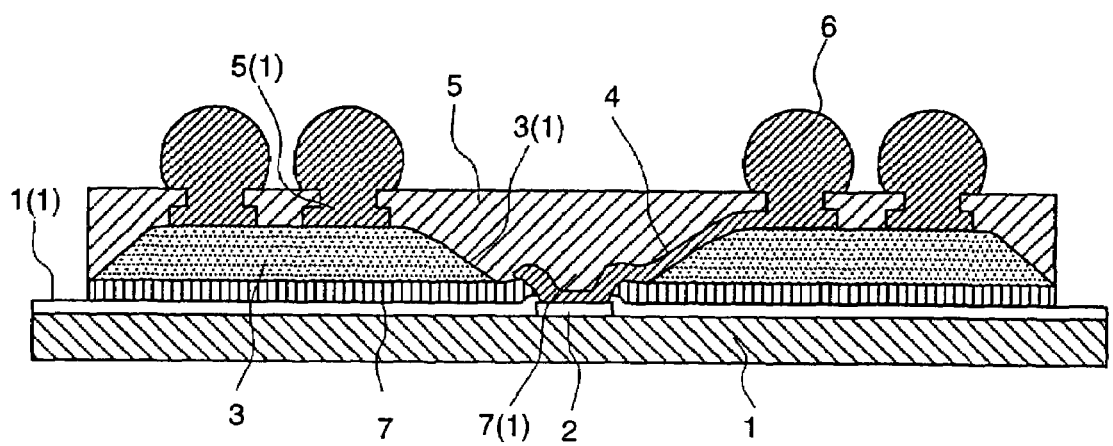
FIG. 18 is cross sectional view showing the constitution of a typical section of the semiconductor device according to a eighteenth embodiment of the present invention.

FIG. 18 is a cross sectional view showing the constitution of a typical section of the semiconductor device according to an eighteenth embodiment of the present invention. Also, FIG. 40 is a view showing a semiconductor device according to an eighteenth embodiment of this invention and illustrates the structure of its substantial part. Further, FIG. 18 shows a sectional view taken along lines A-B in FIG. 40.

In FIG. 18 and FIG. 40, the same numerals are assigned to each of the same components as those shown in FIG. 10.

The constituent difference between the aforementioned semiconductor device of the tenth embodiment (hereinafter referred to as the tenth embodiment device again) and the semiconductor device of the eighteenth embodiment (hereinafter referred to as the eighteenth embodiment device) is only that, with respect to the constitution of the end area of the stress cushioning layer 3 and the end area of the conductor protective layer 5, the tenth embodiment device is structured so that a slit portion is formed in the stress cushioning layer 3, and a slit portion is also formed in the conductor protective layer 5, and their end faces are disposed on the same plane, while the eighteenth embodiment device is structured so that a tapered portion becoming thinner toward the end face is formed on the stress cushioning layer 3, and a slit portion is formed in the conductor protective layer 5, whereby the end (end face) of the tapered portion and the end face of the slit portion are disposed on the same plane, and the thickness of the conductor protective layer 5 compensates for changes in the thickness of the tapered portion. There are no other constituent differences between the tenth embodiment device and the eighteenth embodiment device. Therefore, additional explanation of the constitution of the eighteenth embodiment device will be omitted.

As compared with the method of manufacture of the tenth embodiment device, the method of manufacture of the eighteenth embodiment device is different only in that, with respect to the means of forming the stress cushioning layer 3, the manufacturing method of the tenth embodiment device forms the stress cushioning layer 3 including the opening 3(1) having a gently-inclined rising portion using the mask printing method and then forms a slit portion in the stress cushioning layer 3 by laser processing, while the manufacturing method of the eighteenth embodiment device forms the stress cushioning layer 3 including the opening 3(1) having a gently-inclined rising portion and a tapered portion becoming thinner toward the end face using the mask printing method and does not perform the subsequent laser processing for the stress cushioning layer 3. There are no other differences between the manufacturing method of the tenth embodiment device and the manufacturing method of the eighteenth embodiment device. Therefore, additional explanation of the manufacturing method of the eighteenth embodiment device will be omitted.

The eighteenth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 19:
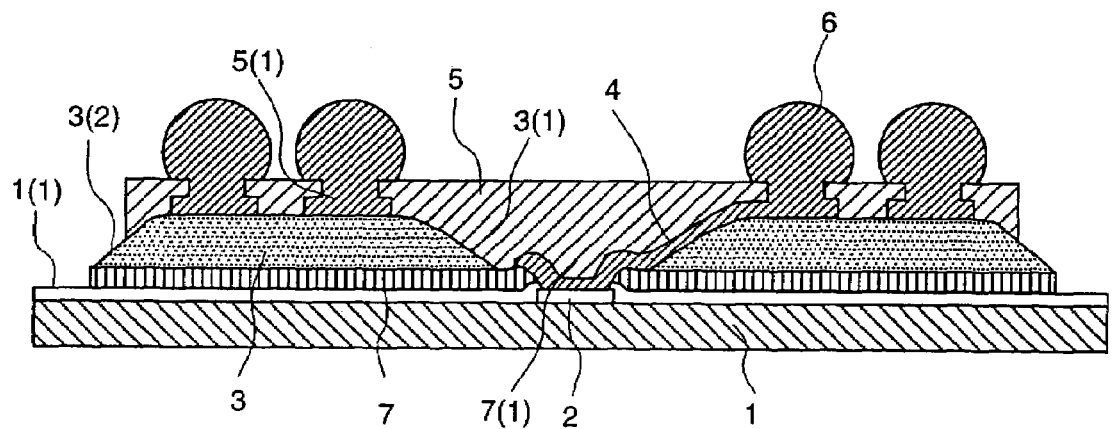
FIG. 19 is cross sectional view showing the constitution of a typical section of the semiconductor device according to a nineteenth embodiment of the present invention.

FIG. 19 is a cross sectional view showing the constitution of a typical section of the semiconductor device according to a nineteenth embodiment of the present invention. Also, FIG. 41 is a view showing a semiconductor device according to a nineteenth embodiment of this invention and illustrates the structure of its substantial part. Further, FIG. 19 shows a sectional view taken along lines A-B in FIG. 41.

In FIG. 19 and FIG. 41, the same numerals are assigned to each of the same components as those shown in FIGS. 5 and 18.

The constituent difference between the aforementioned semiconductor device of the eighteenth embodiment (hereinafter referred to as the eighteenth embodiment device again) and the semiconductor device of the nineteenth embodiment (hereinafter referred to as the nineteenth embodiment device) is only that, with respect to the constitution of the end (end face) of the stress cushioning layer 3 and the end (end face) of the conductor protective layer 5, the eighteenth embodiment device is structured so that the end (end face) of the stress cushioning layer 3 and the end face of the conductor protective layer 5 are disposed on the same plane, while the nineteenth embodiment device is structured so that the end (end face) of the conductor protective layer 5 is positioned inwardly compared with the end (end face) of the stress cushioning layer 3, and an exposed end surface 3(2) is provided on the stress cushioning layer 3. There are no other constituent differences between the eighteenth embodiment device and the nineteenth embodiment device. Therefore, additional explanation of the constitution of the nineteenth embodiment device will be omitted.

The method of manufacture of the nineteenth embodiment device is the same as that of the eighteenth embodiment device except that the mask printing method is used for forming the conductor protective layer 5 instead of the screen printing method. Thus, an explanation of the manufacturing method of the nineteenth embodiment device will be omitted.

The nineteenth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 20:
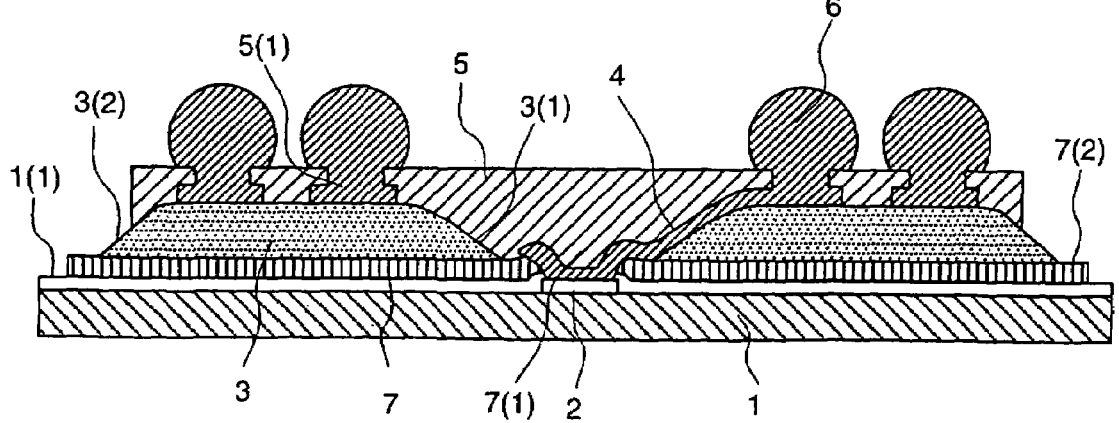
FIG. 20 is cross sectional view showing the constitution of a typical section of the semiconductor device according to a twentieth embodiment of the present invention.

FIG. 20 is a cross sectional view showing the constitution of a typical section of the semiconductor device according to a twentieth embodiment of the present invention. Also, FIG. 42 is a view showing a semiconductor device according to a twentieth embodiment of this invention and illustrates the structure of its substantial part. Further, FIG. 20 shows a sectional view taken along lines A-B in FIG. 42.

In FIG. 20 and FIG. 42, the same numerals are assigned to each of the same components as those shown in FIGS. 12 and 19.

The constituent difference between the aforementioned semiconductor device of the nineteenth embodiment (hereinafter referred to as the nineteenth embodiment device again) and the semiconductor device of the twentieth embodiment (hereinafter referred to as the twentieth embodiment device) is only that, with respect to the constitution of the end (end face) of the semiconductor element protective layer 7 and the end (end face) of the stress cushioning layer 3, the nineteenth embodiment device is structured so that the end face of the semiconductor element protective layer 7 and the end (end face) of the stress cushioning layer 3 are disposed on the same plane, while the twentieth embodiment device is structured so that the end face of the semiconductor element protective layer 7 is positioned outside of the end (end face) of the stress cushioning layer 3 and an exposed end surface 7(2) is provided on the semiconductor element protective layer 7. There are no other constituent differences between the nineteenth embodiment device and the twentieth embodiment device. Therefore, additional explanation of the constitution of the twentieth embodiment device will be omitted.

The method of manufacture of the twentieth embodiment device is the same as that of the nineteenth embodiment device except that the screen printing method is used for forming the conductor protective layer 5 instead of the mask printing method. Thus, an explanation of the manufacturing method of the twentieth embodiment device will be omitted.

The twentieth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 21:
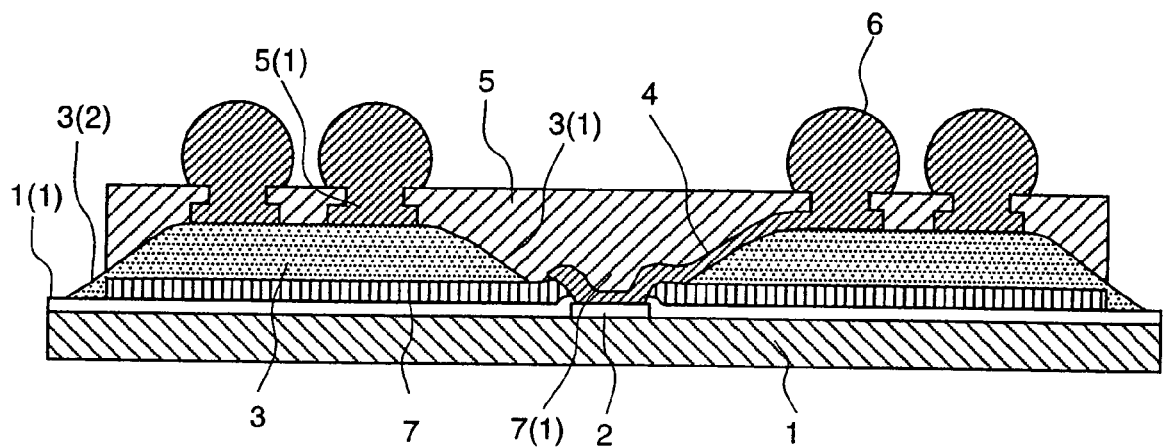
FIG. 21 is cross sectional view showing the constitution of a typical section of the semiconductor device according to a twenty-first embodiment of the present invention.

FIG. 21 is a cross sectional view showing the constitution of a typical section of the semiconductor device according to a twenty-first embodiment of the present invention. Also, FIG. 41 is a view showing a semiconductor device according to a twenty-first embodiment of this invention and illustrates the structure of its substantial part. Further, FIG. 21 shows a sectional view taken along lines A-B in FIG. 41.

In FIG. 21 and FIG. 41, the same numerals are assigned to each of the same components as those shown in FIG. 19.

The constituent difference between the aforementioned semiconductor device of the nineteenth embodiment (hereinafter referred to as the nineteenth embodiment device again) and the semiconductor device of the twenty-first embodiment (hereinafter referred to as the twenty-first embodiment device) is only that, with respect to the constitution of the end (end face) of the semiconductor element protective layer 7 and the end (end face) of the stress cushioning layer 3, the nineteenth embodiment device is structured so that the end face of the semiconductor element protective layer 7 and the end (end face) of the stress cushioning layer 3 are disposed on the same plane, while the twenty-first embodiment device is structured so that the end face of the semiconductor element protective layer 7 is positioned inwardly relative to the end (end face) of the stress cushioning layer 3, practically on the same plane as that of the end face of the conductor protective layer 5. There are no other constituent differences between the nineteenth embodiment device and the twenty-first embodiment device. Therefore, additional explanation of the constitution of the twenty-first embodiment device will be omitted.

The method of manufacture of the twenty-first embodiment device is the same as that of the nineteenth embodiment device, so that an explanation of the method of manufacture of the twenty-first embodiment device will be omitted.

The twenty-first embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 22:
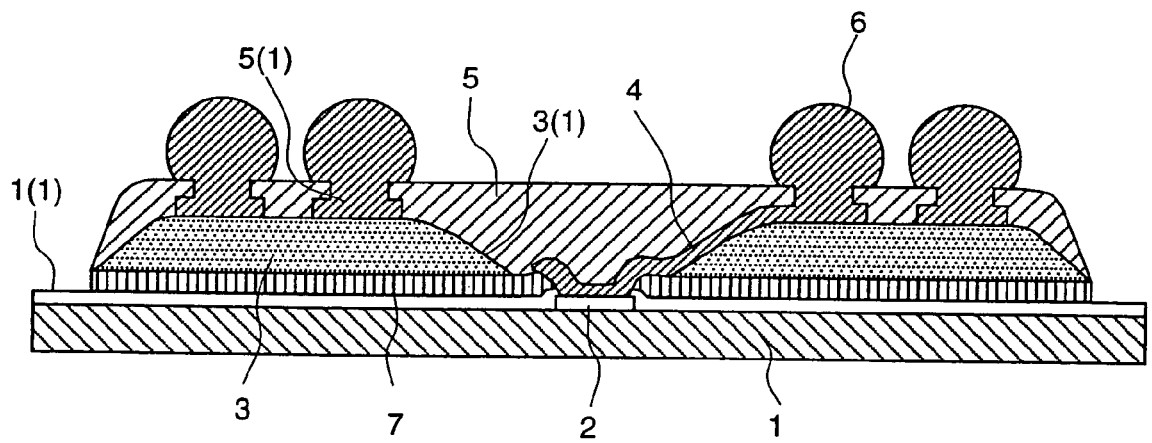
FIG. 22 is cross sectional view showing the constitution of a typical section of the semiconductor device according to a twenty-second embodiment of the present invention.

FIG. 22 is a cross sectional view showing the constitution of a typical section of the semiconductor device according to a twenty-second embodiment of the present invention. Also, FIG. 40 is a view showing a semiconductor device according to a twenty-second embodiment of this invention and illustrates the structure of its substantial part. Further, FIG. 22 shows a sectional view taken along lines A-B in FIG. 40.

In FIG. 22 and FIG. 40, the same numerals are assigned to each of the same components as those shown in FIG. 18.

The constituent difference between the aforementioned semiconductor device of the eighteenth embodiment (hereinafter referred to as the eighteenth embodiment device again) and the semiconductor device of the twenty-second embodiment (hereinafter referred to as the twenty-second embodiment device) is only that, with respect to the constitution of the end area of the conductor protective layer 5, the eighteenth embodiment device is structured so that a slit portion is formed in the conductor protective layer 5 and the end face of the conductor protective layer 5 is almost perpendicular to the end surface 1(1), while the twenty-second embodiment device is structured so that an inclined surface becoming thinner linearly toward the end face of the conductor protective layer 5 is formed. There are no other constituent differences between the eighteenth embodiment device and the twenty-second embodiment device. Therefore, additional explanation of the constitution of the twenty-second embodiment device will be omitted.

When the method of manufacture of the twenty-second embodiment device is compared with that of the eighteenth embodiment device, the difference is only that, with respect to the means of forming the conductor protective player 5, the manufacturing method of the eighteenth embodiment device forms the conductor protective layer 5 including the opening 3(1) having a gently-inclined rising portion and a slit portion having an end face almost perpendicular to the end surface 1(1) using the screen printing method, while the manufacturing method of the twenty-second embodiment device forms the conductor protective layer 5 including the opening 3(1) having a gently-inclined rising portion and an inclined surface having a linearly-inclined rising portion using the screen printing method. There are no other differences between the manufacturing method of the eighteenth embodiment device and the manufacturing method of the twenty-second embodiment device. Therefore, additional explanation of the manufacturing method of the twenty-second embodiment device will be omitted.

The twenty-second embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 23:
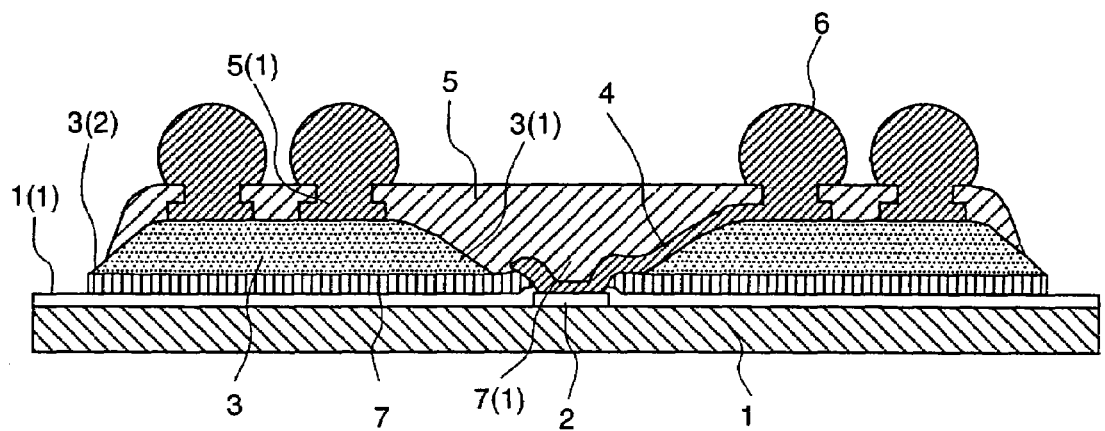
FIG. 23 is cross sectional view showing the constitution of a typical section of the semiconductor device according to a twenty-third embodiment of the present invention.

FIG. 23 is a cross sectional view showing the constitution of a typical section of the semiconductor device according to a twenty-third embodiment of the present invention. Also, FIG. 41 is a view showing a semiconductor device according to a twenty-third embodiment of this invention and illustrates the structure of its substantial part. Further, FIG. 23 shows a sectional view taken along lines A-B in FIG. 41.

In FIG. 23 and FIG. 41, the same numerals are assigned to each of the same components as those shown in FIGS. 5 and 22.

The constituent difference between the aforementioned semiconductor device of the twenty-second embodiment (hereinafter referred to as the twenty-second embodiment device again) and the semiconductor device of the twenty-third embodiment (hereinafter referred to as the twenty-third embodiment device) is only that, with respect to the constitution of the end (end face) of the stress cushioning layer 3 and the end (end face) of the conductor protective layer 5, the twenty-second embodiment device is structured so that the end (end face) of the stress cushioning layer 3 and the end (end face) of the conductor protective layer 5 are disposed on the same plane, while the twenty-third embodiment device is structured so that the end (end face) of the conductor protective layer 5 is positioned inwardly relative to the end (end face) of the stress cushioning layer 3, and an exposed end surface 3(2) is provided on the stress cushioning layer 3. There are no other constituent differences between the twenty-second embodiment device and the twenty-third embodiment device. Therefore, additional explanation of the constitution of the twenty-third embodiment device will be omitted.

The method of manufacture of the twenty-third embodiment device is the same as the manufacturing that of the twenty-second embodiment device except that the mask printing method is used for forming the conductor protective layer 5 instead of the screen printing method. Thus, an explanation of the manufacturing method of the twenty-third embodiment device will be omitted.

The twenty-third embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 24:
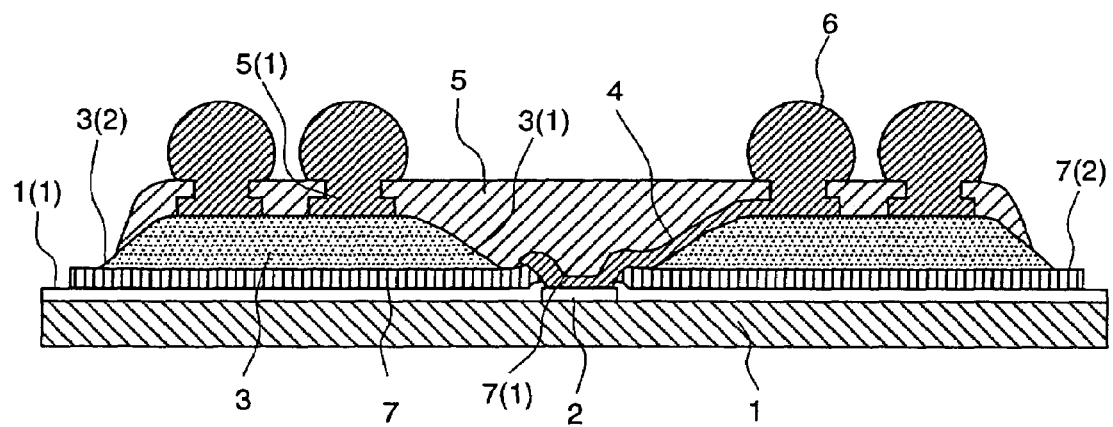
FIG. 24 is cross sectional view showing the constitution of a typical section of the semiconductor device according to a twenty-fourth embodiment of the present invention.

FIG. 24 is a cross sectional view showing the constitution of a typical section of the semiconductor device according to a twenty-fourth embodiment of the present invention. Also, FIG. 42 is a view showing a semiconductor device according to a twenty-fourth embodiment of this invention and illustrates the structure of its substantial part. Further, FIG. 24 shows a sectional view taken along lines A-B in FIG. 42.

In FIG. 24 and FIG. 42, the same numerals are assigned to each of the same components as those shown in FIGS. 20 and 23.

The constituent difference between the aforementioned semiconductor device of the twenty-third embodiment (hereinafter referred to as the twenty-third embodiment device again) and the semiconductor device of the twenty-fourth embodiment (hereinafter referred to as the twenty-fourth embodiment device) is only that, with respect to the constitution of the end face of the semiconductor element protective layer 7 and the end (end face) of the stress cushioning layer 3, the twenty-third embodiment device is structured so that the end face of the semiconductor element protective layer 7 and the end (end face) of the stress cushioning layer 3 are disposed on the same plane, while the twenty-fourth embodiment device is structured so that the end face of the semiconductor element protective layer 7 is positioned outside of the end (end face) of the stress cushioning layer 3, and an exposed end surface 7(2) is provided on the semiconductor element protective layer 7. There are no other constituent differences between the twenty-third embodiment device and the twenty-fourth embodiment device. Therefore, additional explanation of the constitution of the twenty-fourth embodiment device will be omitted.

The method of manufacture of the twenty-fourth embodiment device is the same as that of the twenty-third embodiment device, except that the screen printing method is used for forming the conductor protective layer 5 instead of the mask printing method. Thus, an explanation of the manufacturing method of the twenty-fourth embodiment device will be omitted.

The twenty-fourth embodiment device manufactured by such a method was evaluated as to its suitability immediately after forming the lead wire portion 4, and no unsuitable (defective) lead wire portions found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 25:
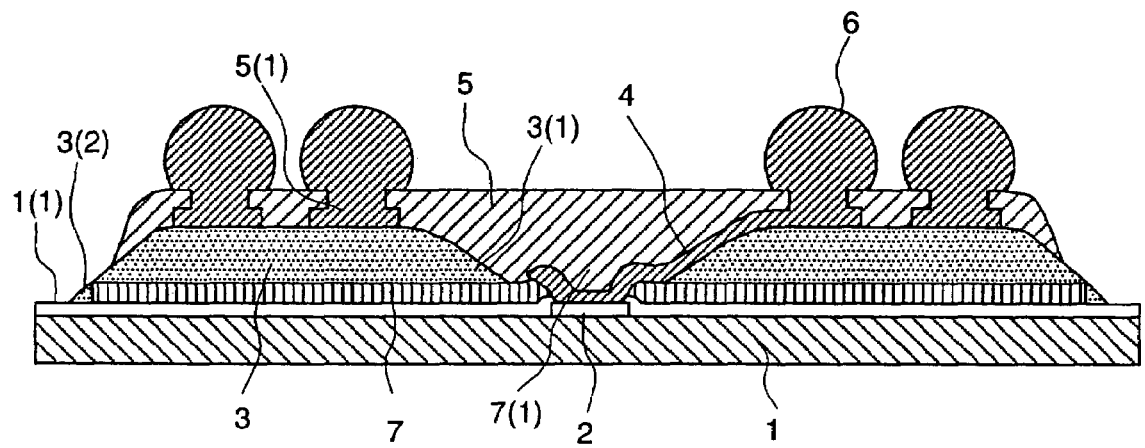
FIG. 25 is cross sectional view showing the constitution of a typical section of the semiconductor device according to a twenty-fifth embodiment of the present invention.

FIG. 25 is a cross sectional view showing the constitution of a typical section of the semiconductor device according to a twenty-fifth embodiment of the present invention. Also, FIG. 41 is a view showing a semiconductor device according to a twenty-fifth embodiment of this invention and illustrates the structure of its substantial part. Further, FIG. 25 shows a sectional view taken along lines A-B in FIG. 41.

In FIG. 25 and FIG. 41, the same numerals are assigned to each of the same components as those shown in FIG. 23.

The constituent difference between the aforementioned semiconductor device of the twenty-third embodiment (hereinafter referred to as the twenty-third embodiment device again) and the semiconductor device of the twenty-fifth embodiment (hereinafter referred to as the twenty-fifth embodiment device) is only that, with respect to the constitution of the end (end face) of the semiconductor element protective layer 7 and the end (end face) of the stress cushioning layer 3, the twenty-third embodiment device is structured so that the end face of the semiconductor element protective layer 7 and the end (end face) of the stress cushioning layer 3 are disposed on the same plane, while the twenty-fifth embodiment device is structured so that the end face of the semiconductor element protective layer 7 is positioned inwardly of the end (end face) of the stress cushioning layer 3, practically on the same plane as that of the end (end face) of the conductor protective layer 5. There are no other constituent differences between the twenty-third embodiment device and the twenty-fifth embodiment device. Therefore, additional explanation of the constitution of the twenty-fifth embodiment device will be omitted.

The method of manufacture of the twenty-fifth embodiment device is the same as that of the twenty-third embodiment device, so that an explanation on the method of manufacture of the twenty-fifth embodiment device will be omitted.

The twenty-fifth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 26:
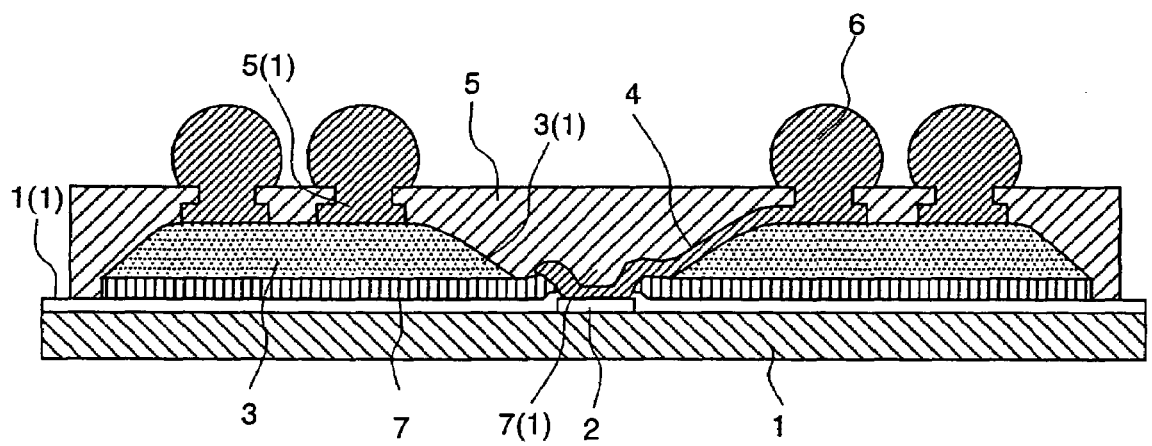
FIG. 26 is cross sectional view showing the constitution of a typical section of the semiconductor device according to a twenty-sixth embodiment of the present invention.

FIG. 26 is a cross sectional view showing the constitution of a typical section of the semiconductor device according to a twenty-sixth embodiment of the present invention. Also, FIG. 40 is a view showing a semiconductor device according to a twenty-sixth embodiment of this invention and illustrates the structure of its substantial part. Further, FIG. 26 shows a sectional view taken along lines A-B in FIG. 40.

In FIG. 26 and FIG. 40, the same numerals are assigned to each of the same components as those shown in FIG. 18.

The constituent difference between the aforementioned semiconductor device of the eighteenth embodiment (hereinafter referred to as the eighteenth embodiment device again) and the semiconductor device of the twenty-sixth embodiment (hereinafter referred to as the twenty-sixth embodiment device) is only that, with respect to the constitution of the end face of the semiconductor element protective layer 7, the end (end face) of the stress cushioning layer 3 and the end face of the conductor protective layer 5, the eighteenth embodiment device is structured so that the end face of the semiconductor element protective layer 7, the end (end face) of the stress cushioning layer 3, and the end face of the conductor protective layer 5 are disposed on the same plane, while the twenty-sixth embodiment device is structured so that, although the end face of the semiconductor element protective layer 7 and the end (end face) of the stress cushioning layer 3 are positioned on the same plane, the end face of the semiconductor element protective layer 7 is positioned outside of this plane, and the outside part of the semiconductor element protective layer 7 reaches the end surface 1(1) of the semiconductor element 1. There are no other constituent differences between the eighteenth embodiment device and the twenty-sixth embodiment device. Therefore, additional explanation of the constitution of the twenty-sixth embodiment device will be omitted.

The method of manufacture of the twenty-sixth embodiment device is the same as that of the eighteenth embodiment device. Thus, an explanation of the manufacturing method of the twenty-sixth embodiment device will be omitted.

The twenty-sixth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 27:
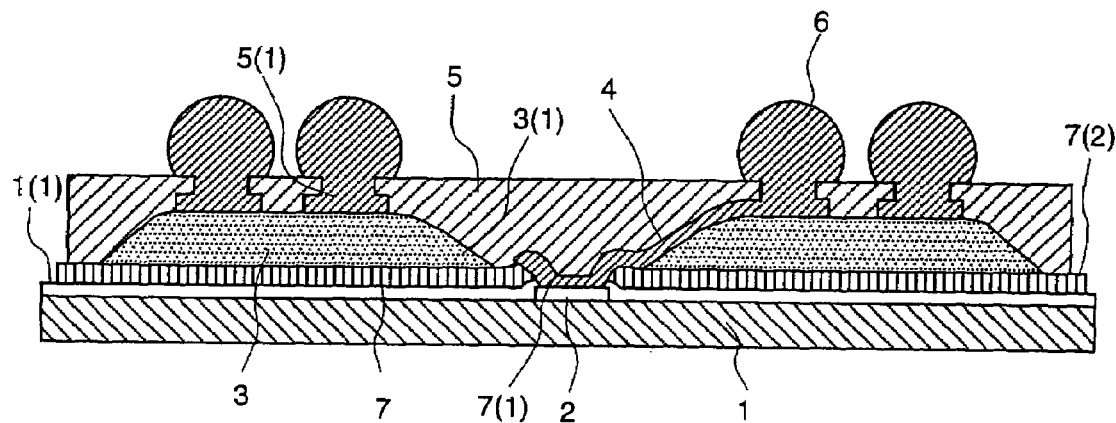
FIG. 27 is cross sectional view showing the constitution of a typical section of the semiconductor device according to a twenty-seventh embodiment of the present invention.

FIG. 27 is a cross sectional view showing the constitution of a typical section of the semiconductor device according to a twenty-seventh embodiment of the present invention. Also, FIG. 43 is a view showing a semiconductor device according to a twenty-seventh embodiment of this invention and illustrates the structure of its substantial part. Further, FIG. 27 shows a sectional view taken along lines A-B in FIG. 43.

In FIG. 27 and FIG. 43, the same numerals are assigned to each of the same components as those shown in FIG. 20.

The constituent difference between the aforementioned semiconductor device of the twentieth embodiment (hereinafter referred to as the twentieth embodiment device again) and the semiconductor device of the twenty-seventh embodiment (hereinafter referred to as the twenty-seventh embodiment device) is only that, with respect to the constitution of the end face of the conductor protective layer 5, the twentieth embodiment device is structured so that the end face of the conductor protective layer 5 is positioned inwardly of the end face of the stress cushioning layer 3, while the twenty-seventh embodiment device is structured so that the end face of the conductor protective layer 5 is positioned outside of the end face of the stress cushioning layer 3, and the outside part of the conductor protective layer 5 of the outside part reaches the exposed end surface 7(2) of the semiconductor element protective layer 7. There are no other constituent differences between the twentieth embodiment device and the twenty-seventh embodiment device. Therefore, additional explanation of the constitution of the twenty-seventh embodiment device will be omitted.

The method of manufacture of the twenty-seventh embodiment device is the same as that of the twentieth embodiment device except that the mask printing method is used for forming the conductor protective layer 5 instead of the screen printing method. Thus, an explanation of the manufacturing method of the twenty-seventh embodiment device will be omitted.

The twenty-seventh embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 28:
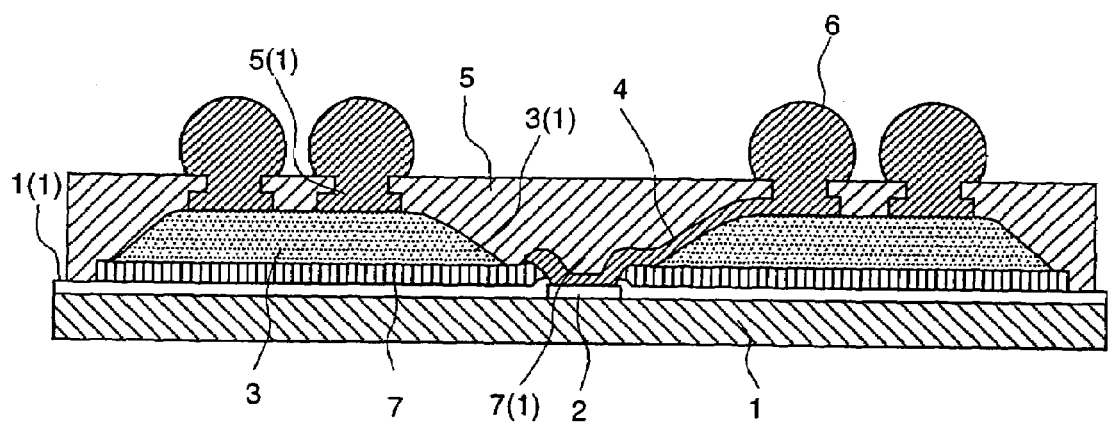
FIG. 28 is cross sectional view showing the constitution of a typical section of the semiconductor device according to a twenty-eighth embodiment of the present invention.

FIG. 28 is a cross sectional view showing the constitution of a typical section of the semiconductor device according to a twenty-eighth embodiment of the present invention. Also, FIG. 40 is a view showing a semiconductor device according to a twenty-eighth embodiment of this invention and illustrates the structure of its substantial part. Further, FIG. 28 shows a sectional view taken along lines A-B in FIG. 40.

In FIG. 28 and FIG. 40, the same numerals are assigned to each of the same components as those shown in FIG. 27.

The constituent difference between the aforementioned semiconductor device of the twenty-seventh embodiment (hereinafter referred to as the twenty-seventh embodiment device again) and the semiconductor device of the twenty-eighth embodiment (hereinafter referred to as the twenty-eighth embodiment device) is only that, with respect to the constitution of the end face of the conductor protective layer 5, the twenty-seventh embodiment device is structured so that the end face of the conductor protective layer 5 is positioned inwardly of the end face of semiconductor element protective layer 7 and on the outside compared with the end (end face) of the stress cushioning layer 3, while the twenty-eighth embodiment device is structured so that the end face of the conductor protective layer 5 is positioned on the outside compared with the end face of the semiconductor element protective layer 7 and the end (end face) of the stress cushioning layer 3. There are no other constituent differences between the twenty-seventh embodiment device and the twenty-eighth embodiment device. Therefore, additional explanation of the constitution of the twenty-eighth embodiment device will be omitted.

The method of manufacture of the twenty-eighth embodiment device is the same as that of the twenty-seventh embodiment device except that the screen printing method is used for forming the conductor protective layer 5 instead of the mask printing method. Thus, an explanation of the manufacturing method of the twenty-eighth embodiment device will be omitted.

The twenty-eighth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 29:
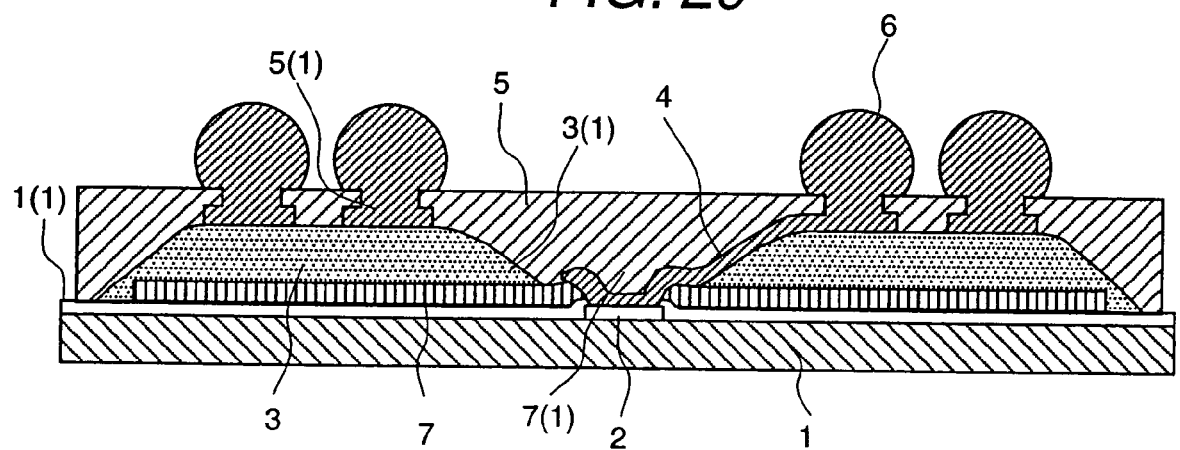
FIG. 29 is cross sectional view showing the constitution of a typical section of the semiconductor device according to a twenty-ninth embodiment of the present invention.

FIG. 29 is a cross sectional view showing the constitution of a typical section of the semiconductor device according to a twenty-ninth embodiment of the present invention. Also, FIG. 40 is a view showing a semiconductor device according to a twenty-ninth embodiment of this invention and illustrates the structure of its substantial part. Further, FIG. 29 shows a sectional view taken along lines A-B in FIG. 40.

In FIG. 29 and FIG. 40, the same numerals are assigned to each of the same components as those shown in FIG. 28.

The constituent difference between the aforementioned semiconductor device of the twenty-eighth embodiment (hereinafter referred to as the twenty-eighth embodiment device again) and the semiconductor device of the twenty-ninth embodiment (hereinafter referred to as the twenty-ninth embodiment device) is only that, with respect to the constitution of the end face of the conductor protective layer 5 and the end (end face) of the stress cushioning layer 3, the twenty-eighth embodiment device is structured so that the end (end face) of the stress cushioning layer 3 is positioned inside of the end face of the semiconductor element protective layer 7, while the twenty-ninth embodiment device is structured so that the end (end face) of the stress cushioning layer 3 is positioned outside of the end face of the semiconductor element layer 7, and the end (end face) of the stress cushioning layer 3 reaches the surface of the semiconductor element 1. There are no other constituent differences between the twenty-eighth embodiment device and the twenty-ninth embodiment device. Therefore, additional explanation of the constitution of the twenty-ninth embodiment device will be omitted.

The method of manufacture of the twenty-ninth embodiment device is the same as that of the twenty-eighth embodiment device, except that the mask printing method is used for forming the conductor protective layer 5 instead of the screen printing method. Thus, an explanation of the manufacturing method of the twenty-ninth embodiment device will be omitted.

The twenty-ninth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 30:
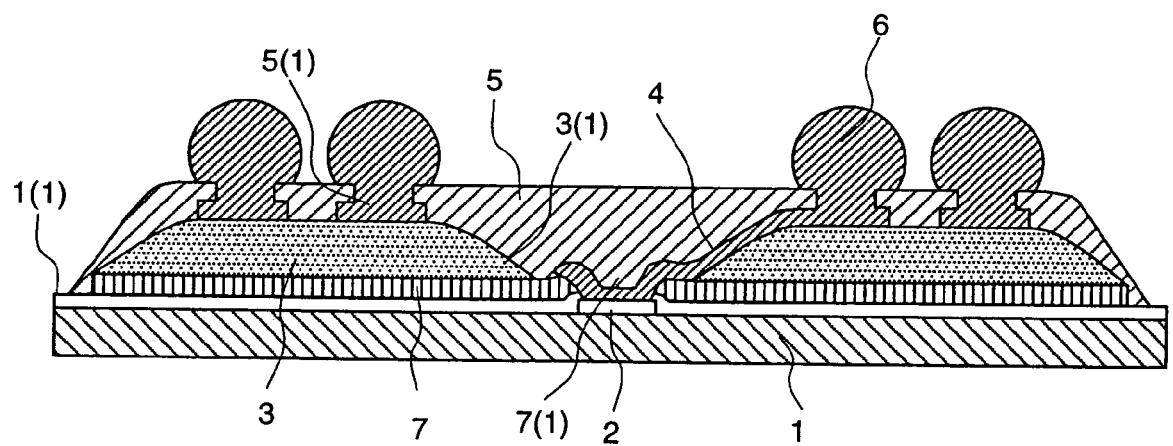
FIG. 30 is cross sectional view showing the constitution of a typical section of the semiconductor device according to a thirtieth embodiment of the present invention.

FIG. 30 is a cross sectional view showing the constitution of a typical section of the semiconductor device according to a thirtieth embodiment of the present invention. Also, FIG. 40 is a view showing a semiconductor device according to a thirtieth embodiment of this invention and illustrates the structure of its substantial part. Further, FIG. 30 shows a sectional view taken along lines A-B in FIG. 40.

In FIG. 30 and FIG. 40, the same numerals are assigned to each of the same components as those shown in FIG. 22.

The constituent difference between the aforementioned semiconductor device of the twenty-second embodiment (hereinafter referred to as the twenty-second embodiment device again) and the semiconductor device of the thirtieth embodiment (hereinafter referred to as the thirtieth embodiment device) is only that, with respect to the constitution of the end face of the conductor protective layer 5, the twenty-second embodiment device is structured so that the end face of the semiconductor element protective layer 7, the end (end face) of the stress cushioning layer 3 and the end (end face) of the conductor protective layer 5 are disposed on the same plane, while the thirtieth embodiment device is structured so that the end face of the semiconductor element protective layer 7 and the end (end face) of the stress cushioning layer 3 are disposed on the same plane, while the end (end face) of the conductor protective layer 5 is positioned outside compared with this same plane, and the end (end face) of the conductor protective layer 5 reaches the surface of the semiconductor element 1. There are no other constituent differences between the twenty-second embodiment device and the thirtieth embodiment device. Therefore, additional explanation of the constitution of the thirtieth embodiment device will be omitted.

The method of manufacture of the thirtieth embodiment device is the same as that of the twenty-second embodiment device. Thus, an explanation of the manufacturing method of the thirtieth embodiment device will be omitted.

The thirtieth embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 31:
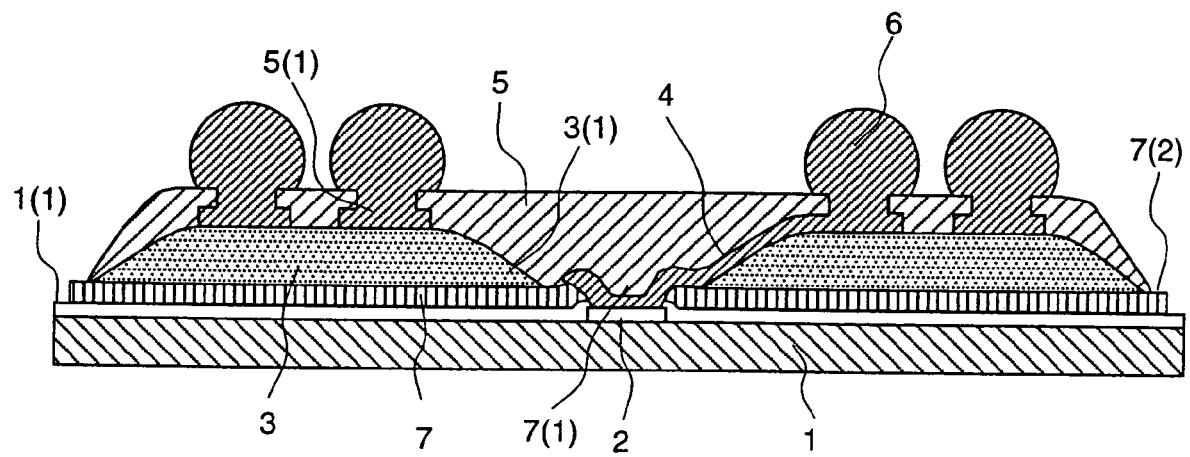
FIG. 31 is cross sectional view showing the constitution of a typical section of the semiconductor device according to a thirty-first embodiment of the present invention.

FIG. 31 is a cross sectional view showing the constitution of a typical section of the semiconductor device according to a thirty-first embodiment of the present invention. Also, FIG. 42 is a view showing a semiconductor device according to a thirty-first embodiment of this invention and illustrates the structure of its substantial part. Further, FIG. 31 shows a sectional view taken along lines A-B in FIG. 42.

In FIG. 31 and FIG. 42, the same numerals are assigned to each of the same components as those shown in FIG. 24.

The constituent difference between the aforementioned semiconductor device of the twenty-fourth embodiment (hereinafter referred to as the twenty-fourth embodiment device again) and the semiconductor device of the thirty-first embodiment (hereinafter referred to as the thirty-first embodiment device) is only that, with respect to the constitution of the end (end face) of the stress cushioning layer 3 and the end (end face) of the conductor protective layer 5, the twenty-fourth embodiment device is structured so that the end (end face) of the stress cushioning layer 3 is positioned outside of the end (end face) of the conductor protective layer 5 and an exposed end surface 3(2) is provided on the stress cushioning layer 3, while the thirty-first embodiment device is structured so that the end face of the semiconductor element protective layer 7 and the end (end face) of the stress cushioning layer 3 are disposed on the same plane and the end (end face) of the stress cushioning layer 3 is positioned inside of the end (end face) of the conductor protective layer 5. There are no other constituent differences between the twenty-fourth embodiment device and the thirty-first embodiment device. Therefore, additional explanation of the constitution of the thirty-first embodiment device will be omitted.

The method of manufacture of the thirty-first embodiment device is the same as that of the twenty-fourth embodiment device except that the mask printing method is used for forming the conductor protective layer 5 instead of the screen printing method. Thus, an explanation of the manufacturing method of the thirty-first embodiment device will be omitted.

The thirty-first embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 32:
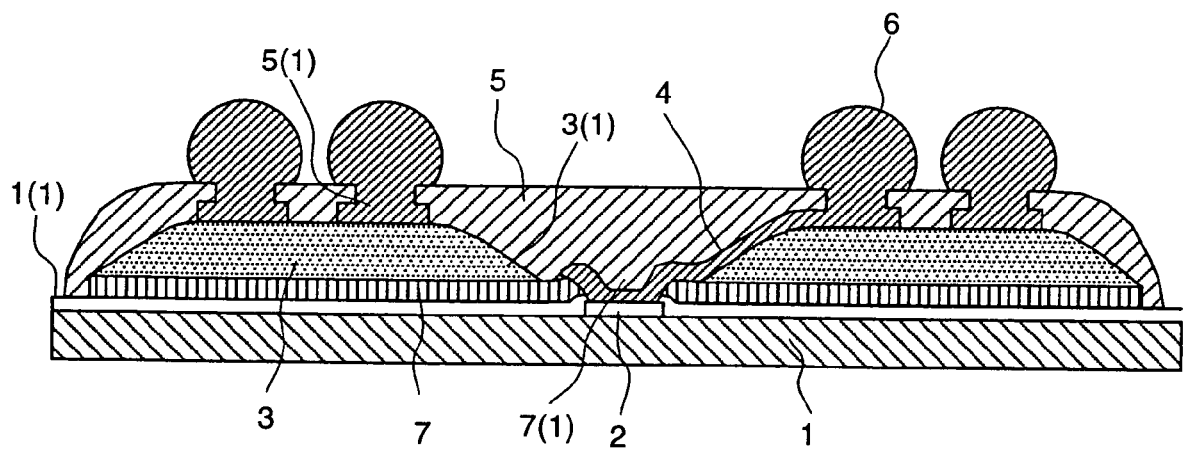
FIG. 32 is cross sectional view showing the constitution of a typical section of the semiconductor device according to a thirty-second embodiment of the present invention.

FIG. 32 is a cross sectional view showing the constitution of a typical section of the semiconductor device according to a thirty-second embodiment of the present invention. Also, FIG. 40 is a view showing a semiconductor device according to a thirty-second embodiment of this invention and illustrates the structure of its substantial part. Further, FIG. 32 shows a sectional view taken along lines A-B in FIG. 40.

In FIG. 32 and FIG. 40, the same numerals are assigned to each of the same components as those shown in FIG. 28.

The constituent difference between the aforementioned semiconductor device of the twenty-eighth embodiment (hereinafter referred to as the twenty-eighth embodiment device again) and the semiconductor device of the thirty-second embodiment (hereinafter referred to as the thirty-second embodiment device) is only that, with respect to the constitution of the end (end face) of the conductor protective layer 5, the twenty-eighth embodiment device is structured so that the end face of the conductor protective layer 5 is installed on the surface of the semiconductor element 1 and is vertical thereto due to formation of the slit portion, while the thirty-second embodiment device is structured so that the end (end face) of the conductor protective layer 5 is formed as a plurality of inclined surfaces having a different inclination angle stepwise. There are no other constituent differences between the twenty-eighth embodiment device and the thirty-second embodiment device. Therefore, additional explanation of the constitution of the thirty-second embodiment device will be omitted.

The method of manufacture of the thirty-second embodiment device is the same as that of the twenty-eighth embodiment device. Thus, an explanation of the manufacturing method of the thirty-second embodiment device will be omitted.

The thirty-second embodiment device manufactured by such a method was evaluated as to its suitability immediately after forming the lead wire portion 4, and no unsuitable (defective) lead wire portions were found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Figure 33:
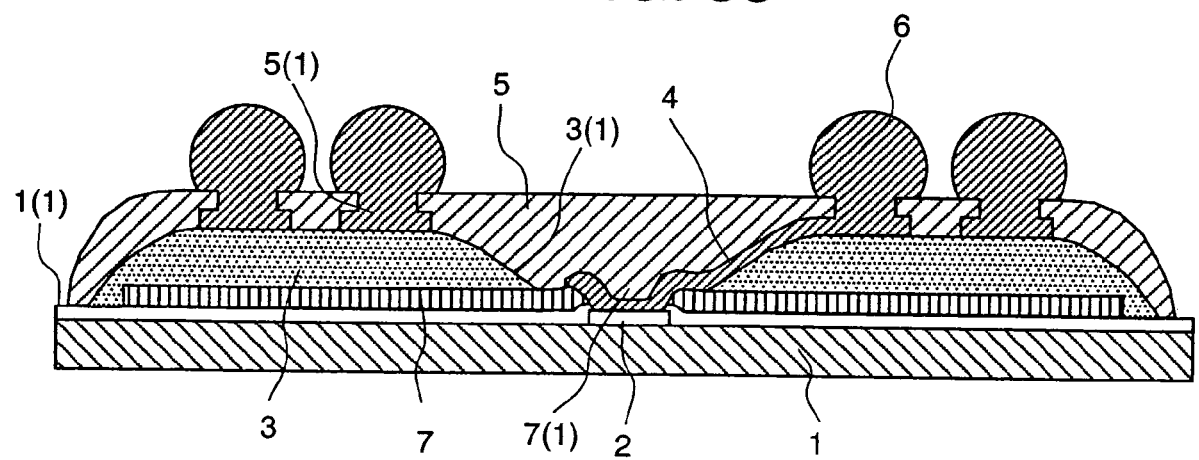
FIG. 33 is cross sectional view showing the constitution of a typical section of the semiconductor device according to a thirty-third embodiment of the present invention.

FIG. 33 is a cross sectional view showing the constitution of a typical section of the semiconductor device according to a thirty-third embodiment of the present invention. Also, FIG. 40 is a view showing a semiconductor device according to a thirty-second embodiment of this invention and illustrates the structure of its substantial part. Further, FIG. 32 shows a sectional view taken along lines A-B in FIG. 40.

In FIG. 33 and FIG. 40, the same numerals are assigned to each of the same components as those shown in FIG. 29.

The constituent difference between the aforementioned semiconductor device of the twenty-ninth embodiment (hereinafter referred to as the twenty-ninth embodiment device again) and the semiconductor device of the thirty-third embodiment (hereinafter referred to as the thirty-third embodiment device) is only that, with respect to the constitution of the end (end face) of the conductor protective layer 5, the twenty-ninth embodiment device is structured so that the end face of the conductor protective layer 5 is disposed on the surface of the semiconductor element 1 and is vertical thereto due to formation of the slit portion, while the thirty-third embodiment device is structured so that the end (end face) of the conductor protective layer 5 is formed as a plurality of inclined surfaces having a different inclination angle stepwise. There are no other constituent differences between the twenty-ninth embodiment device and the thirty-third embodiment device. Therefore, additional explanation of the constitution of the thirty-third embodiment device will be omitted.

The method of manufacture of the thirty-third embodiment device is the same as that of the twenty-ninth embodiment device. Thus, an explanation of the manufacturing method of the thirty-third embodiment device will be omitted.

The thirty-third embodiment device manufactured by such a method was evaluated as to its suitability immediately after forming the lead wire portion 4, and no unsuitable (defective) lead wire portions ere found at all in all the evaluated devices. When an appearance inspection was performed immediately after dicing, it was found that there were no defective semiconductor packages at all, and when the same temperature test as that performed for the first embodiment device was carried out, it was found that there were no defective samples at all.

Meanwhile, with respect to the semiconductor element protective layer 7 to be used for the semiconductor devices of the tenth to thirty-third embodiments, any material that can protect the semiconductor element 1 from the external environment can be used, so that the invention is not limited to use of the aforementioned negative type photosensitive polyimide resin. Namely, materials that may be used are polyimide, polycarbonate, polyester, polytetrafluoroethylene, polyethylene, polypropylene, polyvinylidene fluoride, cellulose acetate, polysulfone, polyacrylonitrile, polyamide, polyamide-imide, epoxy, maleic-imide, phenol, cyanate, polyolefin, and polyurethane, compounds thereof, and mixtures of those compounds, and rubber components, such as acrylic rubber, silicone rubber, or nitrile-butadiene rubber, or an organic compound filler, such as polyimide filler, or inorganic filler such as silica. Furthermore, photosensitive materials including these materials.

With respect to the stress cushioning layer 3 to be used for the semiconductor devicees of the first to thirty-third embodiments, the material to be used is preferably a low-elastomeric resin because it must cushion stress. More specifically, materials that may be used are fluororubber, silicone rubber, silicone fluoride rubber, acrylic rubber, hydrogenated nitrile rubber, ethylene propylene rubber, chlorosulfonated polystyrene, epichlorohydrin rubber, butyl rubber, urethane rubber, polycarbonate/acrylonitrile butadiene styrene alloy, polysiloxane dimethyl terephthalate/polyethylene terephthalate copolymer polybutylene terephthalate/polycarbonate alloy, polytetrafluoroethylene, fluorinated ethylene propylene, polyarylate, polyamide/acrylonitrile butadiene styrene alloy, denatured epoxy, denatured polyolefin, and siloxane detnatured polyamide-imide. In addition to them, various kinds of thermoset resins, or materials combining two or more thermoset resins, or materials with inorganic fillers mixed in thermoset resins may be used, such as epoxy resin, unsaturated polyester resin, epoxy isocyanate resin, maleic-imide resin, maleic-imide epoxy resin, cyanate ester resin, cyanate ester epoxy resin, cyanate ester maleic-imide resin, phenolic resin, diallyl phthalate resin, urethane resin, cyanamide resin, and maleic-imide cyanamide resin. Further, if photosensitivity is given to these resins, the form of the stress cushioning layer 3 can be controlled by a predetermined exposure-development process.

In this case, with respect to the semiconductor device of the present invention, various kinds of semiconductor devices can be manufactured by changing the thickness of the stress cushioning layer 3 and the size of the semiconductor element 1, and each of the semiconductor devices can be mounted on a mounting substrate. A mounting reliability evaluation test was executed within the temperature range from −55° C. to 125° C. The result of the test shows that, assuming the thickness of the stress cushioning layer 3 as t and the distance from the center of gravity of the semiconductor element 1 to the outermost end of the semiconductor element 1 as R, when the relationship of t and R satisfies the formula $t/R \leq 0.01$, the mounting reliability is satisfactory.

Furthermore, the lead wire portion 4 to be used for the semiconductor devices of the first to thirty-third embodiments uses a material of gold (Au), copper (Cu), or aluminum (Al) or a material of copper (Cu) or aluminum (Al) with its surface plated with gold (Au).

The conductor protective layer 5 to be used for the semiconductor devices of the first to thirty-third embodiments is not limited to the material specified above. However, an organic combined part, such as epoxy resin, polyimide resin, or polyamide resin compounded with an inorganic filler, is generally formed on the stress cushioning layer 3, including the lead wire portion 4 and excluding the connected portion of the lead wire portion 4 and the external electrode 6 by screen printing. In this case, a material with a given photosensitivity may be added.

Furthermore, the external electrode 6 to be used for the semiconductor devices of the first to thirty-third embodiments is a conductor electrically connected to the substrate with the semiconductor device mounted thereon, so that the material to be used may be a solder alloy including tin (Sn), zinc (Zn), or lead (Pb), or silver (Ag), Copper (Cu), or gold (Au), or a solder alloy, silver (Ag), or copper (Cu) which is covered with gold (Au) and formed in a ball shape. In addition to these materials, a metal such as molybdenum (Mo), nickel (Ni), copper (Cu), platinum (Pt), or titanium (Ti), or an alloy composed of two or more kinds of the aforementioned metals, or a multi-layer composed of two or more layers may be used.

Next, to compare differences in characteristics with the semiconductor devices of the first to thirty-third embodiments, some semiconductor devices were separately formed as comparison examples.

Figure 34:
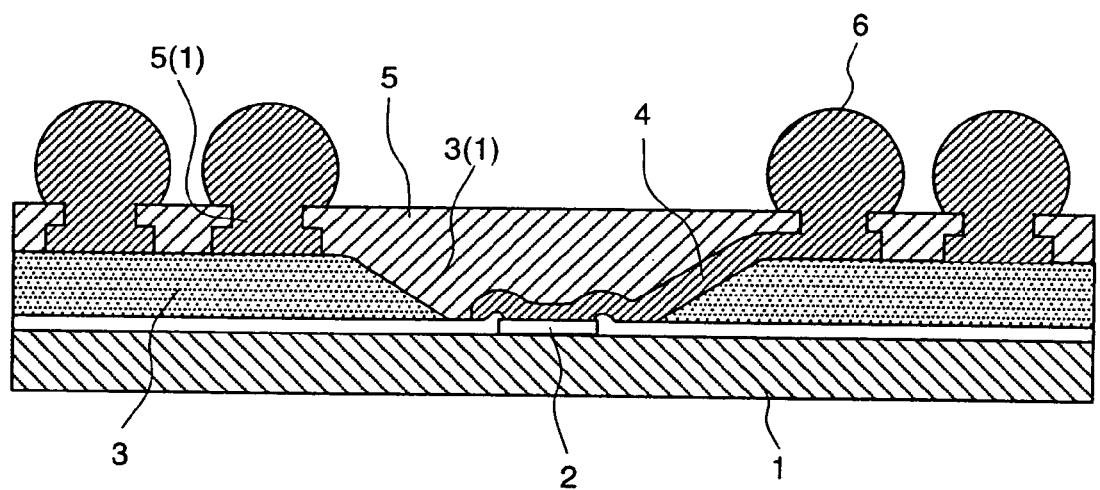
FIG. 34 is cross sectional view showing the constitution of a typical section of a semiconductor device representing a first comparison example.
Figure 44:
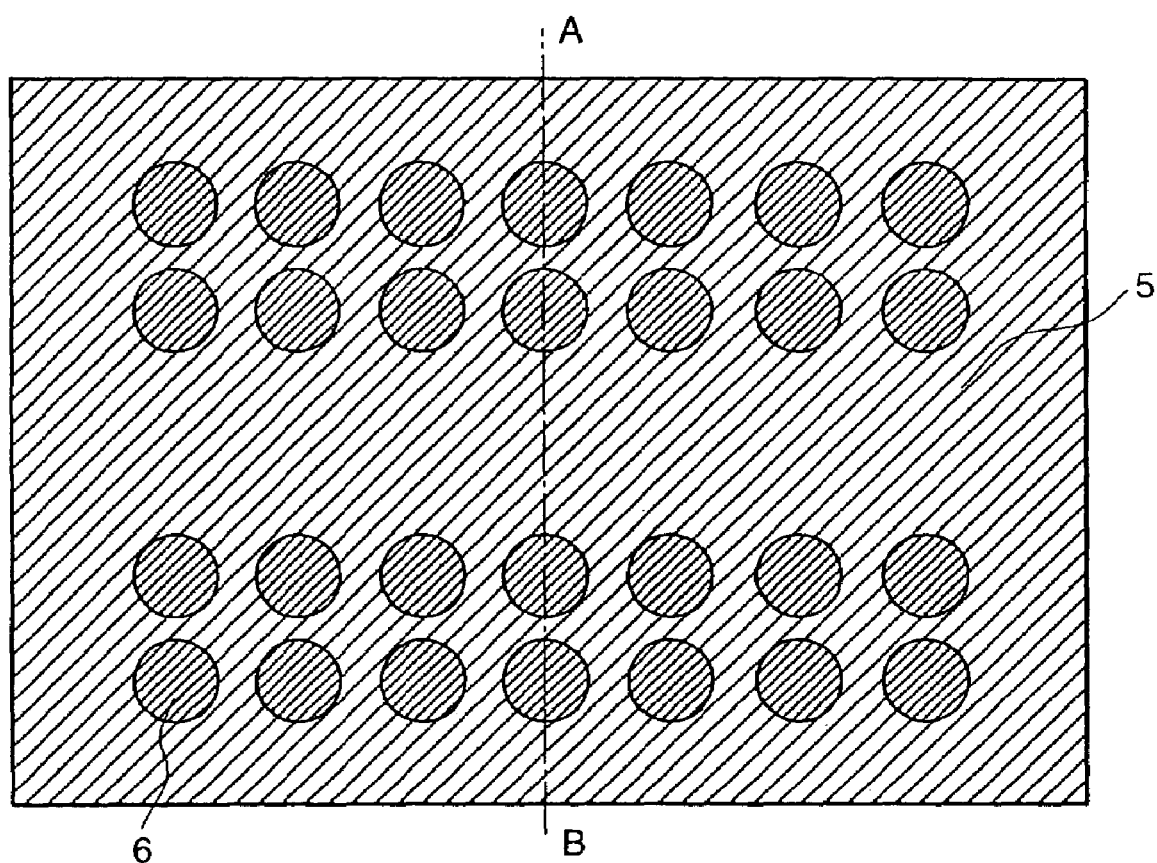
FIG. 44 is a view showing a semiconductor device which constitutes first, second, third and forth comparison examples and illustrates the structure of its substantial part.

FIG. 34 is a cross sectional view showing the constitution of a typical section of a semiconductor device representing a first comparison example. Also, FIG. 44 is a view showing a semiconductor device which is a first comparison example and illustrates the structure of its substantial part. Further, FIG. 34 shows a sectional view taken along lines A-B in FIG. 44.

In FIG. 34 and FIG. 44, the same numerals are assigned to each of the same components as those shown in FIG. 1.

The constituent difference between the aforementioned semiconductor device of the first embodiment (hereinafter referred to as the first embodiment device again) and the semiconductor device of the first comparison example (hereinafter referred to as the first comparison example device) is only that, with respect to the constitution of the end areas of the stress cushioning layer 3 and the conductor protective layer 5, the first embodiment device is structured so that the stress cushioning layer 3 and the conductor protective layer 5 have slit portions extending through the stress cushioning layer 3 and the conductor protective layer 5, respectively, so that the end face of the stress cushioning layer 3 and the end face of the conductor protective layer 5 on the end surface 1(1) of the semiconductor element 1 are formed inside the cutting scribe line formed on a semiconductor wafer, and the end surface 1(1) of the semiconductor element 1 is exposed within the range from the end face to the inside of the scribe line. On the other hand, the first comparison example device is structured so that the end face of the stress cushioning layer 3 and the end face of the conductor protective layer 5 are disposed on the same plane as that of the end face of the semiconductor element 1 and the semiconductor element 1 has no exposed end surface 1(1). There are no other constituent differences between the first embodiment device and the first comparison example device. Therefore, additional explanation of the constitution of the first comparison example device will be omitted.

The method of manufacture of this first comparison example device will be described hereunder. Firstly, positioning marks made of aluminum (Al) indicating an intersection of scribe lines were formed on one side of a semiconductor wafer of silicon (Si); and, in the areas enclosed by the positioning marks, the electrode pads 2 made of aluminum (Al) were formed, respectively, and an integrated circuit portion (not shown in the drawing) are formed.

Next, on the one side of the semiconductor wafer on which the positioning marks and electrode pads 2 are formed, an uncured dry film composed of epoxy resin, orthocresol novolac curing agent, acrylic rubber, and silica filler, having a thickness of 100 µm and a coefficient of elasticity of 3000 MPa at room temperature after curing, was adhered in an environment of 150° C. using a roll laminator, and the adhered dry film was heated and cured at 150° C. for one hour, thus the stress cushioning layer 3 was formed.

Next, oxygen plasma etching was carried out, and the residue of the stress cushioning layer 3 on the electrode pads 2 was removed. The oxide film on the surface of the electrode pads 2 was also removed, and then a chromium (Cr) film with a thickness of 500 A was deposited in the opening 3(1) of the stress cushioning layer 3 and on the stress cushioning layer 3 itself. A copper (Cu) film with a thickness of 0.5 µm was then deposited on it. Then, a negative type photosensitive resist was spin-coated on the deposited film and prebaked, exposed, and developed, and a resist wiring pattern with a thickness of 15 µm was formed. A copper (Cu) film with a thickness of 10 µm was formed inside the formed wiring pattern by electroplating, and a nickel (Ni) film with a thickness of 2 µm was formed on it by electroplating. Thereafter, the resist was peeled off using a release liquid, and the copper (Cu) film in the deposited film was etched by an ammonium persulfate/sulfuric acid solution. Furthermore, the chromium (Cr) film in the deposited film was etched by a potassium permanganate solution, and the lead wire portion 4 was formed. At the point of time when the lead wire portion 4 is formed, the same evaluation (the first evaluation) as that for the semiconductor device of the first embodiment was performed.

Then, a photosensitive solder resist varnish was coated on the stress cushioning layer 3 including the lead wire portion 4 by screen printing, and the coated film was dried at 80° C. for 20 minutes, then exposed and developed using a predetermined pattern, and heated and cured at 150° C. for one hour, whereby the conductor protective layer 5 having a plurality of windows 5(1) at a part of the lead wire portion 4 was formed.

Next, a gold (Au) deposit film with a thickness of 0.1 µm was formed on the nickel (Ni) film of the lead wire portion 4, which is exposed via the windows 5(1) by replacement plating. Thereafter, flux was coated on the gold (Au) deposit film using a metal mask, and solder balls of Sn—Ag—Cu series with a diameter of about 0.35 mm were put on it, and the solder balls were heated in an infrared reflow furnace at 260° C. for 10 seconds, whereby the external electrodes 6 were formed.

Finally, the semiconductor chip was cut with a dicing saw with a thickness of 0.2 mm along the scribe line and a plurality of semiconductor devices were obtained. In this case, the same evaluation (the second evaluation) as that for the semiconductor device of the first embodiment was performed for the obtained semiconductor devices, and moreover, the same temperature test as that for the semiconductor device of the first embodiment was carried out, and then the evaluation (a third evaluation) was performed again.

In the semiconductor devices of the first comparison example manufactured by such a manufacturing method, at the first evaluation time, defective conductor patterns of about 30% were generated for the lead wire portion 4, and at the second evaluation (appearance inspection) time immediately after dicing, defective semiconductor devices of about 20% were generated because large mechanical stress was applied to the cutting portion of a plurality of layers during dicing. Furthermore, at the third evaluation time after the temperature test, package defects, such as a disconnection defect, were generated in almost all samples because large mechanical stress during dicing and also large thermal stress during the changing of the temperature were applied to the cutting portion of a plurality of layers.

Figure 35:
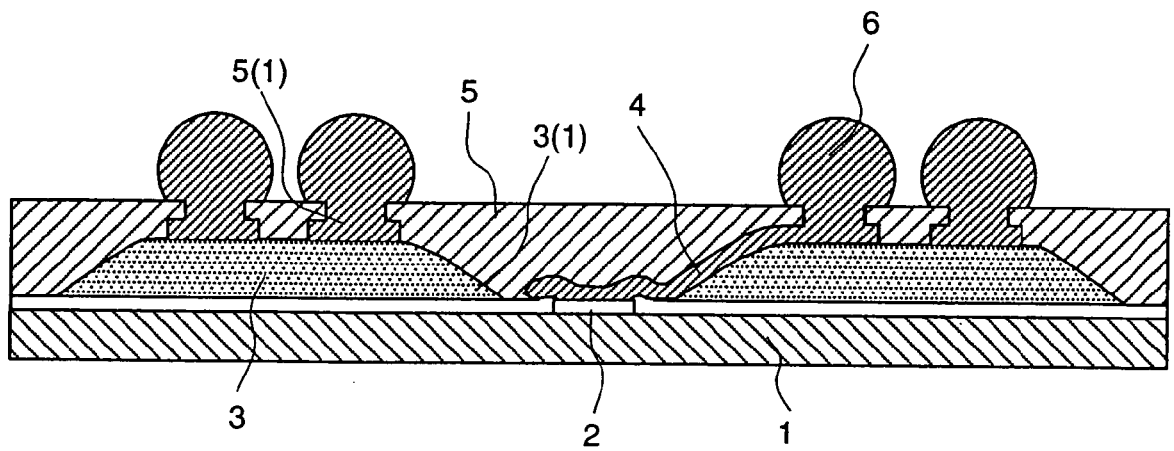
FIG. 35 is cross sectional view showing the constitution of a typical section of a semiconductor device representing a second comparison example.

FIG. 35 is a cross sectional view showing the constitution of a typical section of a semiconductor device representing a second comparison example. Also, FIG. 44 is a view showing a semiconductor device which is a second comparison example and illustrates the structure of its substantial part. Further, FIG. 35 shows a sectional view taken along lines A-B in FIG. 44.

In FIG. 35 and FIG. 44, the same numerals are assigned to each of the same components as those shown in FIG. 6.

The constituent difference between the aforementioned semiconductor device of the sixth embodiment (hereinafter referred to as the sixth embodiment device again) and the semiconductor device of the second comparison example (hereinafter referred to as the second comparison example device) is only that, with respect to the constitution of the end area of the stress cushioning layer 3, the sixth embodiment device is structured so that the conductor protective layer 5 has a slit portion reaching the bottom thereof, so that the end face of the conductor protective layer 5 on the end surface 1(1) of the semiconductor element 1 is formed inside the cutting scribe line formed on a semiconductor wafer, and the end surface 1(1) of the semiconductor element 1 is exposed within the range from the end face to the inside of the scribe line, while the second comparison example device is structured so that the end face of the conductor protective layer 5 is installed on the same plane as that of the end face of the semiconductor element 1 and the semiconductor element 1 has no exposed end surface 1(1). There are no other constituent differences between the sixth embodiment device and the second comparison example device. Therefore, additional explanation of the constitution of the second comparison example device will be omitted.

As compared with the method of manufacture of the sixth embodiment device, the method of manufacturing of the second comparison example device is different only in that, in the manufacture of the sixth embodiment device, a slit portion is formed in the conductor protective layer 5 when the conductor protective layer 5 is formed by screen printing, while the method of manufacture of the second comparison example device forms no slit in the conductor protective layer 5. There are no other differences between the manufacturing method of the sixth embodiment device and the manufacturing method of the second comparison example device. Therefore, additional explanation of the manufacturing method of the second comparison example device will be omitted.

In the semiconductor devices of the second comparison example manufactured by such a manufacturing method, at the first evaluation time, defective conductor patterns of 30% or more were generated for the lead wire portion 4, and at the second evaluation (appearance inspection) time immediately after dicing, defective semiconductor devices of about 20% were generated during dicing. Furthermore, at the third evaluation time, after the temperature test, package defects, such as a disconnection defect, were generated in almost all samples.

Figure 36:
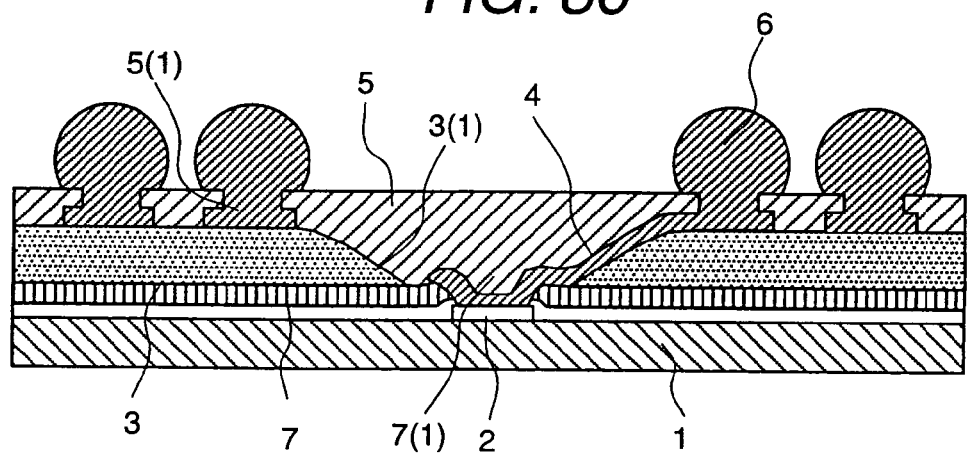
FIG. 36 is cross sectional view showing the constitution of a typical section of a semiconductor device representing a third comparison example.

FIG. 36 is a cross sectional view showing the constitution of a typical section of a semiconductor device representing a third comparison example. Also, FIG. 44 is a view showing a semiconductor device which is a third comparison example and illustrates the structure of its substantial part. Further, FIG. 36 shows a sectional view taken along lines A-B in FIG. 44.

In FIG. 36 and FIG. 44, the same numerals are assigned to each of the same components as those shown in FIG. 10.

The constituent difference between the aforementioned semiconductor device of the tenth embodiment (hereinafter referred to as the tenth embodiment device again) and the semiconductor device of the third comparison example (hereinafter referred to as the third comparison example device) is only that, with respect to the constitution of the respective end areas of the semiconductor element protective layer 7, the stress cushioning layer 3 and the conductor protective layer 5, the tenth embodiment device is structured so that the semiconductor element protective layer 7, the stress cushioning layer 3 and the conductor protective layer 5 have slit portions reaching the bottom of the semiconductor element protective layer 7, the bottom of the stress cushioning layer 3, and the bottom of the conductor protective layer 5, so that the end face of the semiconductor element protective layer 7, the end face of the stress cushioning layer 3, and the end face of the conductor protective layer 5 on the end surface 1(1) of the semiconductor element 1 are formed inside the cutting scribe line formed on a semiconductor wafer, and the end surface 1(1) of the semiconductor element 1 is exposed within the range from the end face to the inside of the scribe line. On the other hand, the third comparison example device is structured so that the end face of the semiconductor element protective layer 7, the end face of the stress cushioning layer 3, and the end face of the conductor protective layer 5 are respectively installed on the same plane as that of the end face of the semiconductor element 1 and the semiconductor element 1 has no exposed end surface 1(1). There are no other constituent differences between the tenth embodiment device and the third comparison example device. Therefore, additional explanation of the constitution of the third comparison example device will be omitted.

The method of manufacture of the third comparison example device is the same as the method of manufacture of the tenth embodiment device, so that the explanation on the manufacturing method of the third comparison example device will be omitted.

In the semiconductor devices of the third comparison example manufactured by such a manufacturing method, at the first evaluation time, defective conductor patterns of slightly lower than 30% were generated for the lead wire portion 4, and at the second evaluation (appearance inspection) time, immediately after dicing, defective semiconductor devices of about 30% were generated during dicing. Furthermore, at the third evaluation time, after the temperature test, package defects such as a disconnection defect, were generated in almost all samples.

Figure 37:
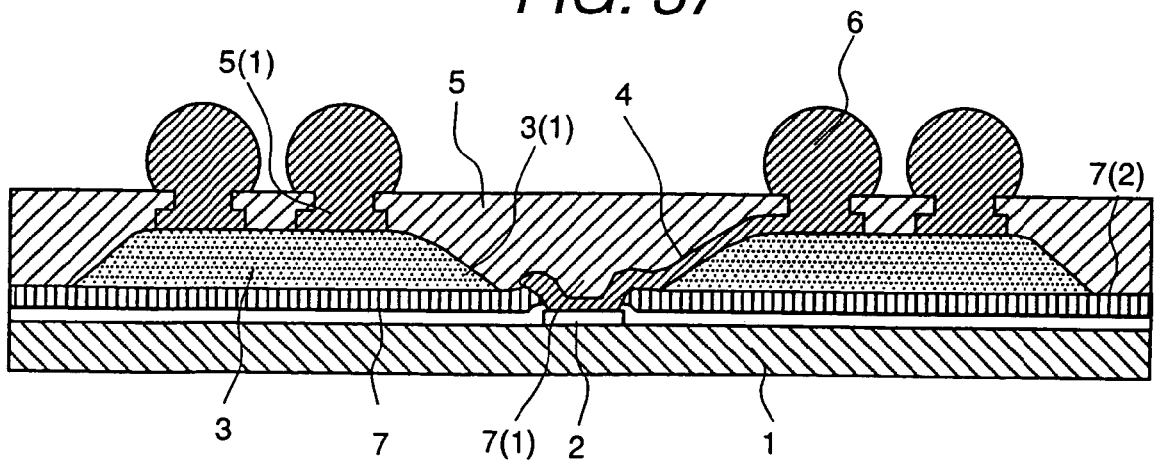
FIG. 37 is cross sectional view showing the constitution of a typical section of a semiconductor device representing a fourth comparison example.

FIG. 37 is a cross sectional view showing the constitution of a typical section of a semiconductor device representing a fourth comparison example. Also, FIG. 44 is a view showing a semiconductor device which is a forth comparison example and illustrates the structure of its substantial part. Further, FIG. 37 shows a sectional view taken along lines A-B in FIG. 44.

In FIG. 37 and FIG. 44, the same numerals are assigned to each of the same components as those shown in FIG. 28.

The constituent difference between the aforementioned semiconductor device of the twenty-eighth embodiment (hereinafter referred to as the twenty-eighth embodiment device again) and the semiconductor device of the fourth comparison example (hereinafter referred to as the fourth comparison example device) is only that, with respect to the constitution of the respective end areas of the semiconductor element protective layer 7 and the conductor protective layer 5, the twenty-eighth embodiment device is structured so that the semiconductor element protective layer 7 and the conductor protective layer 5 respectively have slit portions reaching the bottom of the semiconductor element protective layer 7 and the bottom of the conductor protective layer 5, so that the end face of the conductor protective layer 5 is positioned on the outside compared with the end face of the semiconductor element protective layer 7, and the end face of the conductor protective layer 5 is formed inside the cutting scribe line formed on a semiconductor wafer, whereby the end surface 1(1) of the semiconductor element 1 is exposed within the range from the end face to the inside of the scribe line. On the other hand, the fourth comparison example device is structured so that the end face of the semiconductor element protective layer 7 and the end face of the conductor protective layer 5 are respectively installed on the same plane as that of the end face of the semiconductor element 1, and the semiconductor element 1 has no exposed end surface 1(1). There are no other constituent differences between the twenty-eighth embodiment device and the fourth comparison example device. Therefore, additional explanation of the constitution of the fourth comparison example device will be omitted.

The method of manufacture of the fourth comparison example device is the same as the method of manufacture of the twenty-eighth embodiment device, so that the explanation of the manufacturing method of the fourth comparison example device will be omitted.

In the semiconductor devices of the fourth comparison example manufactured by such a manufacturing method, at the first evaluation time, defective conductor patterns of about 30% were generated for the lead wire portion 4, and at the second evaluation (appearance inspection) time, immediately after dicing, defective semiconductor devices of about 30% were generated during dicing. Furthermore, at the third evaluation time, after the temperature test, package defects, such as a disconnection defect, were generated in almost all samples.

As mentioned above, as compared with the semiconductor devices of the first to fourth comparison examples, the semiconductor devices of the first to thirty-third embodiments are structured so that the respective end faces of the stress cushioning layer 3 and the conductor protective layer 5, or the respective end faces of the semiconductor element protective layer 7, the stress cushioning layer 3, and the conductor protective layer 5, are formed inside the scribe line inside the end face of the semiconductor element 1, so that a semiconductor wafer can be cut by surely recognizing the positioning marks located on the semiconductor wafer during cutting of the semiconductor wafer, whereby occurrences of defective semiconductor packages due to variations of the cutting position of each of the obtained semiconductor devicees can be eliminated.

In the semiconductor devices of the first to thirty-third embodiments, when each semiconductor device is to be obtained by cutting a semiconductor wafer, the cut portion of each semiconductor device is formed as a single-layer structure of only the semiconductor, so that even if mechanical stress is generated during cutting of the semiconductor wafer, the mechanical stress is just applied to the single-layer structure and a plurality of resin layers can be prevented from peeling off due to the mechanical force.

Furthermore, in the semiconductor devices of the first to thirty-third embodiments, even if thermal stress is generated due to great changes in the environmental temperature during mounting of each semiconductor device and the thermal stress is applied to a plurality of resin layers, large mechanical stress is not applied to the plurality of resin layers during cutting of the semiconductor wafer and the plurality of resin layers are little damaged, so that peeling-off of the plurality of resin layers due to the thermal stress does not occur at all or very little.

As mentioned above, according to the semiconductor device and semiconductor device manufacturing method of the present invention, the respective end faces of the stress cushioning layer and conductor protective layer, or the respective end faces of the semiconductor element protective layer, stress cushioning layer, and conductor protective layer in the end surface area of the semiconductor element, are formed inside the semiconductor wafer cutting scribe line, and the semiconductor element is exposed within the range from the end face to the inside of the scribe line, so that when the semiconductor wafer is to be cut along the semiconductor wafer cutting scribe line, it can be cut by surely recognizing the positioning marks located on the semiconductor wafer and an effect can be produced such that occurrences of defective semiconductor packages due to variations in the cutting position of each obtained semiconductor device can be eliminated.

According to the semiconductor device and semiconductor device manufacturing method of the present invention, when each semiconductor device is to be obtained by cutting a semiconductor wafer, the cut portion of each semiconductor device is formed as a single-layer structure of only semiconductor element, and even if mechanical stress is generated during cutting of the semiconductor wafer, the mechanical stress is just applied to the single-layer structure, so that an effect can be produced such that a plurality of resin layers will not be peeled off by the mechanical force.

Furthermore, according to the semiconductor device and semiconductor device manufacturing method of the present invention, even if thermal stress is generated due to great changes in the environmental temperature during mounting of each semiconductor device and the thermal stress is applied to a plurality of resin layers, large mechanical stress is not applied to the plurality of resin layers during cutting of the semiconductor wafer, and the plurality of resin layers are little damaged, so that an effect can be produced such that the plurality of resin layers will not be peeled off at all or very little by the thermal stress.

As a result, according to the semiconductor device and semiconductor device manufacturing method of the present invention, an effect can be produced such that each semiconductor device is not damaged at all or very little by application of mechanical stress and thermal stress thereto, whereby the reliability of semiconductor devices can be enhanced, and the yield rate during manufacture of semiconductor devices can be improved.

What is claimed is:

1. A semiconductor device manufacturing method comprising a first step of forming a plurality of semiconductor elements having an integrated circuit and an electrode pad on a circuit forming surface of a semiconductor wafer, a second step of forming a stress cushioning layer on a plurality of semiconductor elements, a third step of forming an opening in an electrode pad area of said stress cushioning layers, and forming a notch wider than a width of a scribe line in said stress cushioning layer on said cutting scribe line of said semiconductor wafer, a fourth step of forming a lead wire portion extending from said electrode pad and onto said stress cushioning layer via said opening, a fifth step of forming a conductor protective layer which covers said stress cushioning layer and said lead wire portion and has an external electrode connection window portion on said lead wire portion, and also has a notch wider than said width of said scribe line at a position corresponding to said notch of said stress cushioning layer, a sixth step of forming an external electrode in said external electrode connection window portion, and a seventh step of cutting said semiconductor wafer along said cutting scribe line and obtaining a plurality of semiconductor devices in minimum units, wherein an end face obtained by said notch of said conductor protective layer at said fifth step is distanced from a cutting plane of said semiconductor wafer cutting scribe line.

2. A semiconductor device manufacturing method according to claim 1, wherein said notch of said conductor protective layer is substantially devoid of any material at initiation of said seventh step of cutting said semiconductor wafer along said cutting scribe line.

3. A semiconductor device manufacturing method according to claim 1, wherein said notch of said stress cushioning layer is substantially devoid of any material at initiation of said seventh step of cutting said semiconductor wafer along said cutting scribe line.

4. A semiconductor device manufacturing method comprising a first step of forming a plurality of semiconductor elements having an integrated circuit and an electrode pad on a circuit forming surface of a semiconductor wafer, a second step of forming a semiconductor element protective layer on a plurality of semiconductor elements, a third step of forming a first opening in an electrode pad area of said semiconductor element protective layer, and forming a notch wider than a width of a scribe line in said semiconductor element protective layer on said culling scribe line of said semiconductor wafer, a fourth step of forming a stress cushioning layer on said semiconductor element protective layer, a fifth step of forming a second opening in said electrode pad area of said stress cushioning layer, and forming a notch wider than said width of said scribe line at a position corresponding to said notch of said semiconductor element protective layer in said stress cushioning layer on said culling scribe line of said semiconductor wafer, a sixth step of forming a lead wire portion extending from said electrode pad and onto said stress cushioning layer via said first opening and said second opening, a seventh step of forming a conductor protective layer which covers said stress cushioning layer and said lead wire portion, and which has an external electrode connection window portion on said lead wire portion, and a notch at a position corresponding to said notch of said stress cushioning layer, an eighth step of forming an external electrode in said external electrode connection window portion, and a ninth step of cutting said semiconductor wafer along said cutting scribe line and obtaining a plurality of semiconductor devices in minimum units, wherein an end face obtained by said notch of said stress cushioning layer at said fourth step is distanced from a cutting lane of said semiconductor wafer cutting scribe line; and an end face obtained by said notch of said conductor protective layer at said seventh step is distanced from a cutting plane of said semiconductor wafer cutting scribe line.

5. A semiconductor device manufacturing method according to claim 4, wherein said end face obtained by said notch of said stress cushioning layer at said fourth step, is formed inside an end face formed by said notch of said semiconductor element protective layer.

6. A semiconductor device manufacturing method according to claim 4, wherein said end face obtained by said notch of said stress cushioning layer at said fourth step, is formed outside an end face formed by said notch of said semiconductor element protective layer.

7. A semiconductor device manufacturing method according to claim 4, wherein said end face obtained by said notch of said stress cushioning layer at said fourth step, is formed so as to be installed on the same plane as that of an end face formed by said notch of said semiconductor element protective layer.

8. A semiconductor device manufacturing method according to claim 4, wherein said end face obtained by said notch of said conductor protective layer at said seventh step, is formed inside an end face formed by said notch of said semiconductor element protective layer.

9. A semiconductor device manufacturing method according to claim 4, wherein said end face obtained by said notch of said conductor protective layer at said seventh step, is formed outside an end face formed by said notch of said semiconductor element protective layer.

10. A semiconductor device manufacturing method according to claim 9, wherein said end face obtained by said notch of said conductor protective layer at said fifth step is formed inside an end face formed by said notch of said stress cushioning layer.

11. A semiconductor device manufacturing method according to claim 9, wherein said end face obtained by said notch of said conductor protective layer at said fifth step is formed outside an end face formed by said notch of said stress cushioning layer.

12. A semiconductor device manufacturing method according to claim 4, wherein said end face obtained by said notch of said conductor protective layer at said seventh step, is formed so as to be installed on the same plane as that of an end face formed by said notch of said semiconductor element protective layer.

13. A semiconductor device manufacturing method according to claim 4, wherein said end face obtained by said notch of said conductor protective layer at said seventh step, is formed inside an end face formed by said notch of said semiconductor element protective layer and an end face formed by said notch of said stress cushioning layer.

14. A semiconductor device manufacturing method according to claim 4, wherein said end face obtained by said notch of said conductor protective layer at said seventh step, is formed outside an end face formed by said notch of said semiconductor element protective layer and an end face formed by said notch of said stress cushioning layer.

15. A semiconductor device manufacturing method according to claim 4, wherein said end face obtained by said notch of said conductor protective layer at said seventh step, is formed outside an end face formed by said notch of said semiconductor element protective layer and an end face formed by said notch of said stress cushioning layer.

16. A semiconductor device manufacturing method according to claim 4, wherein said end face obtained by said notch of said conductor protective layer at said seventh step, is formed between an end face formed by said notch of said semiconductor element protective layer and an end face formed by said notch of said stress cushioning layer.

17. A semiconductor device manufacturing method according to claim 4, wherein said end face obtained by said notch of said conductor protective layer at said seventh step, is formed to be installed on the same plane as that of an end face formed by said notch of said semiconductor element protective layer and an end face formed by said notch of said stress cushioning layer.

18. A semiconductor device manufacturing method according to claim 4, wherein said notch of said conductor protective layer of said seventh step, is substantially devoid of any material at initiation of said ninth step of cutting said semiconductor wafer along said cutting scribe line.

19. A semiconductor device manufacturing method according to claim 4, wherein said notch of said stress cushioning layer of said fourth step, is substantially devoid of any material at initiation of said ninth step of cutting said semiconductor wafer along said cutting scribe line.

* * * * *